(12) United States Patent
Montorsi et al.

(10) Patent No.: US 12,149,347 B2
(45) Date of Patent: Nov. 19, 2024

(54) PERMUTATED EXTENSION AND SHORTENED LOW DENSITY PARITY CHECK CODES FOR HYBRID AUTOMATIC REPEAT REQUEST

(71) Applicant: Huawei Technologies Co., Ltd., Shenzhen (CN)

(72) Inventors: Guido Montorsi, Turin (IT); Sergio Benedetto, Turin (IT); Yan Xin, Kanata (CA); Wei Lin, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 18/170,854

(22) Filed: Feb. 17, 2023

(65) Prior Publication Data

US 2023/0208555 A1    Jun. 29, 2023

Related U.S. Application Data

(63) Continuation of application No. PCT/CN2020/110350, filed on Aug. 20, 2020.

(51) Int. Cl.
*H03M 13/00* (2006.01)
*H03M 13/25* (2006.01)
*H03M 13/27* (2006.01)
*H04L 1/00* (2006.01)

(52) U.S. Cl.
CPC ........ *H04L 1/0057* (2013.01); *H03M 13/255* (2013.01); *H03M 13/271* (2013.01)

(58) Field of Classification Search
CPC .. H04L 1/0057; H04L 1/1819; H03M 13/255; H03M 13/271; H03M 13/116; H03M 13/6306; H03M 13/1151; H03M 13/1157; H03M 13/118; H03M 13/618
See application file for complete search history.

(56) References Cited

U.S. PATENT DOCUMENTS

| | | | | |
|---|---|---|---|---|
| 7,743,315 B2* | 6/2010 | Li | ........ | H03M 13/033 714/801 |
| 8,977,925 B2* | 3/2015 | Zaytsev | ........ | H03M 13/09 714/752 |
| 10,153,785 B1* | 12/2018 | Kumar | ........ | H03M 13/1174 |
| 10,474,529 B2* | 11/2019 | Chen | ........ | H03M 13/373 |

(Continued)

FOREIGN PATENT DOCUMENTS

| | | |
|---|---|---|
| CN | 101378303 A | 4/2009 |
| WO | 2008086735 A1 | 7/2009 |

(Continued)

OTHER PUBLICATIONS

[802.11ayD5.0] Draft P802.11ay_D5.0 Oct. 2019.

(Continued)

*Primary Examiner* — Esaw T Abraham

(57) ABSTRACT

Method and system method performed at a wireless transmitting station, including generating a first low density parity check (LPDC) codeword for a first source word for a first transmission, and generating a second LDPC codeword for a retransmission for the first LDPC codeword, the second LDPC codeword including a permutated subset of information bits included in the first LDPC codeword and parity check bits corresponding to the permutated subset of information bits.

20 Claims, 12 Drawing Sheets

(56) References Cited

U.S. PATENT DOCUMENTS

| | | | | |
|---|---|---|---|---|
| 11,050,440 B2* | 6/2021 | Shih | .................... | H03M 13/152 |
| 11,321,175 B2* | 5/2022 | Kumar | .............. | H03M 13/2906 |
| 2008/0273452 A1* | 11/2008 | Khan | .................. | H04B 7/0669 |
| | | | | 370/310 |
| 2020/0162196 A1 | 5/2020 | Jeong et al. | | |

FOREIGN PATENT DOCUMENTS

| | | | |
|---|---|---|---|
| WO | 2017091244 | A1 | 6/2017 |
| WO | 2018174569 | A1 | 9/2018 |
| WO | 2019071317 | | 1/2019 |
| WO | 2020143019 | A1 | 7/2020 |

OTHER PUBLICATIONS

R. G. Gallager, "Low-density parity-check codes," IRE Trans. Inf. Theory, vol. 8, No. 1, pp. 21-28 1962.

T. Richardson and S. Kudekar, "Design of Low-Density Parity Check Codes for 5G New Radio", IEEE Commun. Magzine, pp. 17-34 Mar. 2018.

D. Divsalar, et al, "Capacity-Approaching Protograph Codes", IEEE J. of Selected Area on Commun., 876-888 Aug. 2009.

IEEE P802.aaax/D6.0 Draft Standard for Information Technology Telecommunications and information exchange between systems Local and metropolitan area networks. Nov. 2019.

A. Price and J. Hall, "Survey of trapping sets and stopping sets", arXiv:1705.05996v1 [cs.IT] May 17, 2017.

[802.11REVmdD3.2] Draft P802. 11REVmd_D3.2, Part 11: Wireless LAN Medium Access Control (MAC) and Physical Layer (PHY) Specifications. pp. 3017-3021 and 4390-4392. Mar. 2020.

\* cited by examiner

PERMUTATED EXTENSION AND SHORTENED LOW DENSITY PARITY CHECK CODES FOR HYBRID AUTOMATIC REPEAT REQUEST

RELATED APPLICATIONS

The present application is a continuation of International Patent Application Number PCT/CN2020/110350, filed Aug. 20, 2020, the contents of which are incorporated herein by reference.

TECHNICAL FIELD

The present application relates to mobile air interface technologies, in particular to methods and systems for retransmitting data.

BACKGROUND

Automatic repeat request (ARQ) is an error-control method for data transmission that can be applied to improve reliability in a communication system such as a wireless communication system.

ARQ protocols are specified as medium access control (MAC) procedures in networks that operate according to Wi-Fi protocols such as IEEE 802.11a/n/ac/ad [802.11REVmdD3.2], IEEE 802.11ax [802.11axD6.0], IEEE 802.11ay [802.11ayD5.0]. ARQ is a MAC procedure in which a transmitter retransmits the same data packet when retransmission is needed. A receiver discards the erroneous data packet after detecting errors in a MAC protocol data unit (MPDU) and performs decoding each transmitted/retransmitted data packet independently.

ARQ is simple and can provide high system reliability. However, the throughput of ARQ decreases significantly with an increase in channel error rate. Forward error correction (FEC) can maintain constant system throughput when channel errors are fully corrected. However, it is hard to achieve high system reliability. Combination of ARQ and FEC, hybrid ARQ (HARQ), provides very promising solutions for high reliability systems such as cellular systems 3GPP 4G LTE [3GPP TS 36.212 v12.0.0] and 5G NR [3GPP TS 38.212 v15.2.0].

The next generation of Wi-Fi systems are expected to have high data rate and high reliability data transmission requirements. Hybrid ARQ (HARQ), which has traditionally been applied in cellular systems, is considered to be a promising candidate to achieve the high requirements of next generation of Wi-Fi.

Low-density parity-check (LDPC) codes are capacity-approaching block codes. Although LDPC codes have been used in the IEEE 802.11 family of protocols, starting with the IEEE 802.11n protocol, existing W-Fi LDPC codes are designed without consideration of HARQ with incremental redundancy transmission.

There are two general types of HARQ in general for LDPC codes:

Chase combining (CC): In CC, the log-likelihood ratio (LLR) values of a previously transmitted codeword detected with errors are stored at receiver. During a retransmission, the transmitter will retransmit the same codeword. The receiver will combine the stored the LLR values of the codeword received previously and the LLR values of the newly received codeword. The transmitted and retransmitted codewords are the same. In CC, after a retransmission, the code rate of the encoder is unchanged. Performance is improved from the combining gain and diversity gain.

Incremental redundancy (IR): In IR, compared to a previous transmission, additional parity check bits are transmitted during a retransmission at transmitter. At the receiver, the LLRs of those additional parity bits transmitted in a retransmission are combined with the LLRs of the codeword bits previously transmitted. This results in a decrease in code rate of the encoder, therefore improving performance.

Turbo codes have been used in cellular applications since the deployment of 3G/4G and 3GPP cellular systems. Incremental redundancy HARQ (IR-HARQ) can be achieved by transmitting different puncturing patterns of the mother turbo codes. Recently adopted LDPC codes for 5G cellular wireless systems have taken into account the capability to optimized performance of IR-HARQ.

However, there is a need for LDPC codes that can be used to efficiently support IR-HARQ in Wi-Fi systems.

SUMMARY

According to a first aspect, a method performed at a wireless transmitting station is disclosed. The method includes generating a first low density parity check (LPDC) codeword for a first source word for a first transmission, and generating a second LDPC codeword for a retransmission for the first LDPC codeword, the second LDPC codeword including a permutated subset of information bits included in the first LDPC codeword and parity check bits corresponding to the permutated subset of information bits.

According to examples of the preceding aspect, the first LDPC codeword conforms to a first parity check matrix and the second LDPC codeword conforms to a second parity check matrix that is derived by permuting locations in the first parity check matrix that correspond to information bits and copying a portion of the first parity matrix that corresponds to parity check bits.

According to examples of one or more of the preceding aspects, the first LDPC codeword and the second LDPC codeword are each generated using an identical generator matrix.

According to examples of one or more of the preceding aspects, the first LDPC codeword and the second LDPC codeword have the same length, and generating the second LDPC codeword through LDPC encoding comprises including a plurality of bits from the first source word in a second source word in an order that is different than the order that the plurality of bits are included in the first source word, wherein a further plurality of bits from the first source word are not included in the second source word, wherein the second source word is the same length as the first source word and bit locations in the second source word that are not populated with bits from the first source word are set to zero.

According to examples of one or more of the preceding aspects, the order of the bits is specified by a predefined permutation and shortening map that maps locations of a plurality of bits in the first source word to locations of the same bits in the second source word.

According to examples of one or more of the preceding aspects, the permutation and shortening map maps the order of sets of successive bits from locations in the first source word to successive bit locations in the second source word.

According to examples of one or more of the preceding aspects, the method can include generating multiple LDPC codewords for multiple successive retransmissions for the first LDPC codeword, the multiple LDPC codewords each including a unique permutated subset of information bits included in the first LDPC codeword and parity check bits corresponding to the permutated subset of information bits.

According to examples of one or more of the preceding aspects, the method can include transmitting a retransmission codeword that comprises information bits and parity check bits from the second LDPC codeword.

According to examples of one or more of the preceding aspects, the method can include transmitting a retransmission codeword that comprises information bits from the first LDPC codeword and parity check bits from the second LDPC codeword, the retransmission codeword being the same length as the first codeword.

According to examples of one or more of the preceding aspects, the method can include transmitting a retransmission codeword that comprises parity check bits from the second LDPC codeword and does not include information code bits from the second LDPC codeword.

According to examples of one or more of the preceding aspects, the method can include transmitting the first LDPC codeword in a wireless local area network for a destination station and receiving a message from the destination station indicating that the first LDPC codeword has not been properly decoded.

According to a further aspect is a wireless transmitting station configured to perform the methods of any of the preceding aspects.

According to further aspect is non-volatile computer readable medium storing instructions for configuring a wireless transmitting station configured to perform the methods of any of the preceding aspects According to a further aspect is a wireless receiver station configured to receive and decode codewords transmitted according to the methods of any of the preceding aspects.

BRIEF DESCRIPTION OF THE DRAWINGS

Reference will now be made, by way of example, to the accompanying figures which show example embodiments of the present application, and in which:

FIG. 9 illustrates elected rows from a table that defines a set of permutation and shortening maps that correspond to base PCM $H_b$ (4×24) for coding rate 5/6 LDPC code with n=1944 and Z=81.

FIG. 10 shows an example of original base PCM $H_b(0)$ and an extension base PCM $H_b(1)$.

Like reference numerals are used throughout the Figures to denote similar elements and features. While aspects of the invention will be described in conjunction with the illustrated embodiments, it will be understood that it is not intended to limit the invention to such embodiments.

DETAILED DESCRIPTION OF EXAMPLE EMBODIMENTS

The present disclosure teaches methods, devices, and systems for retransmitting data in a wireless network. Next generation WLAN systems, including for example next generation Wi-Fi systems, will require higher data rates and higher reliability than prior generation systems. HARQ error control methods, and in particular IR-HARQ error control methods may help achieve high data rate and reliability goals. As noted above, HARQ error control includes a combination of ARQ and FEC error control methods.

The present disclosure describes LDPC codes that are configured to support IR-HARQ error control methods. The disclosed LDPC codes are obtained by permuting and shortening information bits from an LDPC code such as a Wi-Fi LDPC code with optimized HARQ error rate performance after each retransmission.

Figure 1:
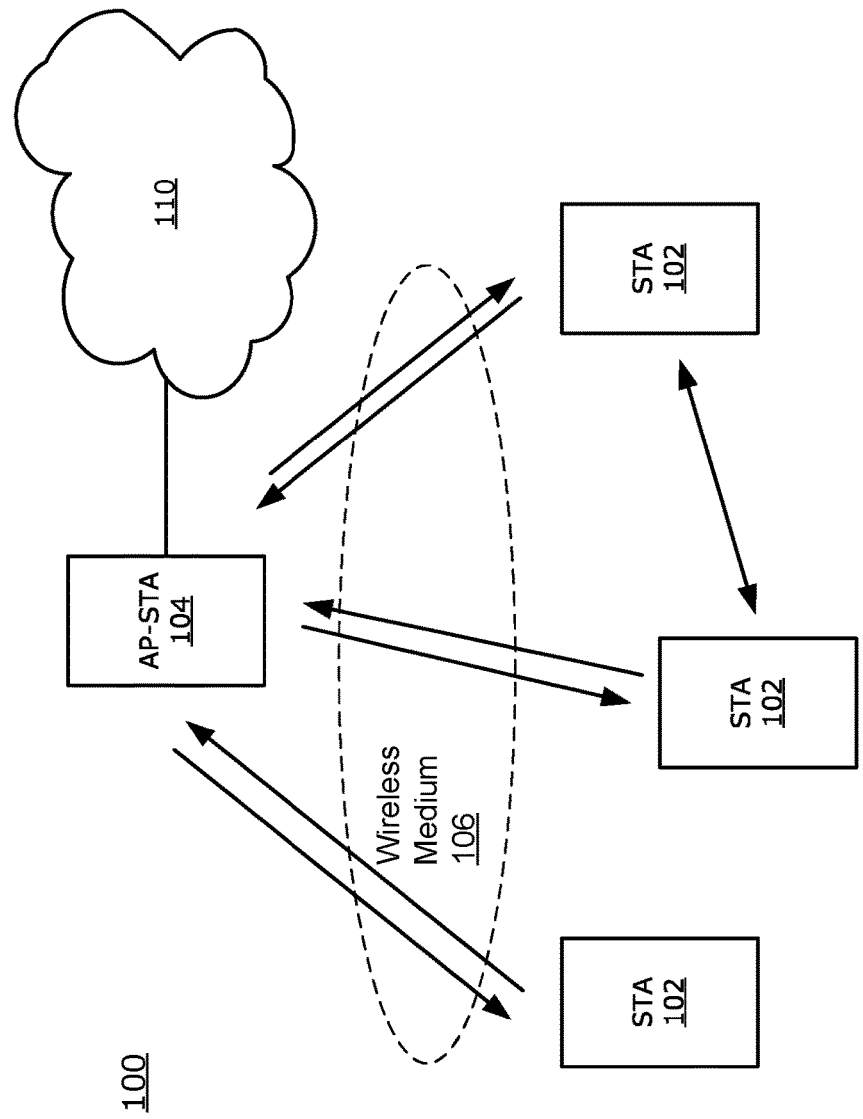
FIG. 1 is a block diagram illustrating an example communication network in accordance with one implementation of the present disclosure.

An example of an environment in which the error control procedures described below can operate will be provided with reference to FIGS. 1 and 2. FIG. 1 illustrates a communication network 100 comprising a plurality of stations (STAs) that can include fixed, portable, and moving stations. The example of FIG. 1 illustrates a single fixed STA, access-point station (AP-STA) 104, and a plurality of STAs 102 that may be portable or mobile. Each of the STAs 102 and AP-STA 104 may include a transmitter, a receiver, an encoder, a decoder, a modulator, and/or demodulator as described herein. The network 100 may operate according to one or more communications or data standards or technologies, however in at least some examples the network 100 is a WLAN, and in at least some examples is a next generation Wi-Fi compliant network that operates in accordance with one or more protocols from the 802.11 family of protocols.

Each STA 102 may be a laptop, a desktop PC, PDA, Wi-Fi phone, wireless transmit/receive unit (WTRU), mobile station (MS), mobile terminal, smartphone, mobile telephone, sensor, internet of things (IOT) device, or other wireless enabled computing or mobile device. In some embodiments, a STA 102 comprises a machine which has the capability to send, receive, or send and receive data in the communications network 100 but which performs primary functions other than communications. In some embodiments, a machine includes an apparatus or device with means to transmit and/or receive data through the communications network 100 but such apparatus or device is not typically operated by a user for the primary purpose of communications. The AP-STA 104 may comprise a network access interface which functions as a wireless transmission and/or reception point for STAs 102 in the network 100. The AP-STA 104 may be connected to a backhaul network 110 which enables data to be exchanged between the AP-STA 104 and other remote networks (including for example the Internet), nodes, APs, and devices (not shown). The AP-STA 104 may support communications through unlicensed radio frequency spectrum wireless medium 106 with each STA 102 by establishing uplink and downlink communications channels with each STA 102, as represented by the arrows in FIG. 1. In some examples, STAs 102 may be configured to communicate with each other. Communications in the network 100 may be unscheduled, scheduled by the AP-STA 104 or by a scheduling or management entity (not shown) in the network 100, or a mix of scheduled and unscheduled communications.

Figure 2:
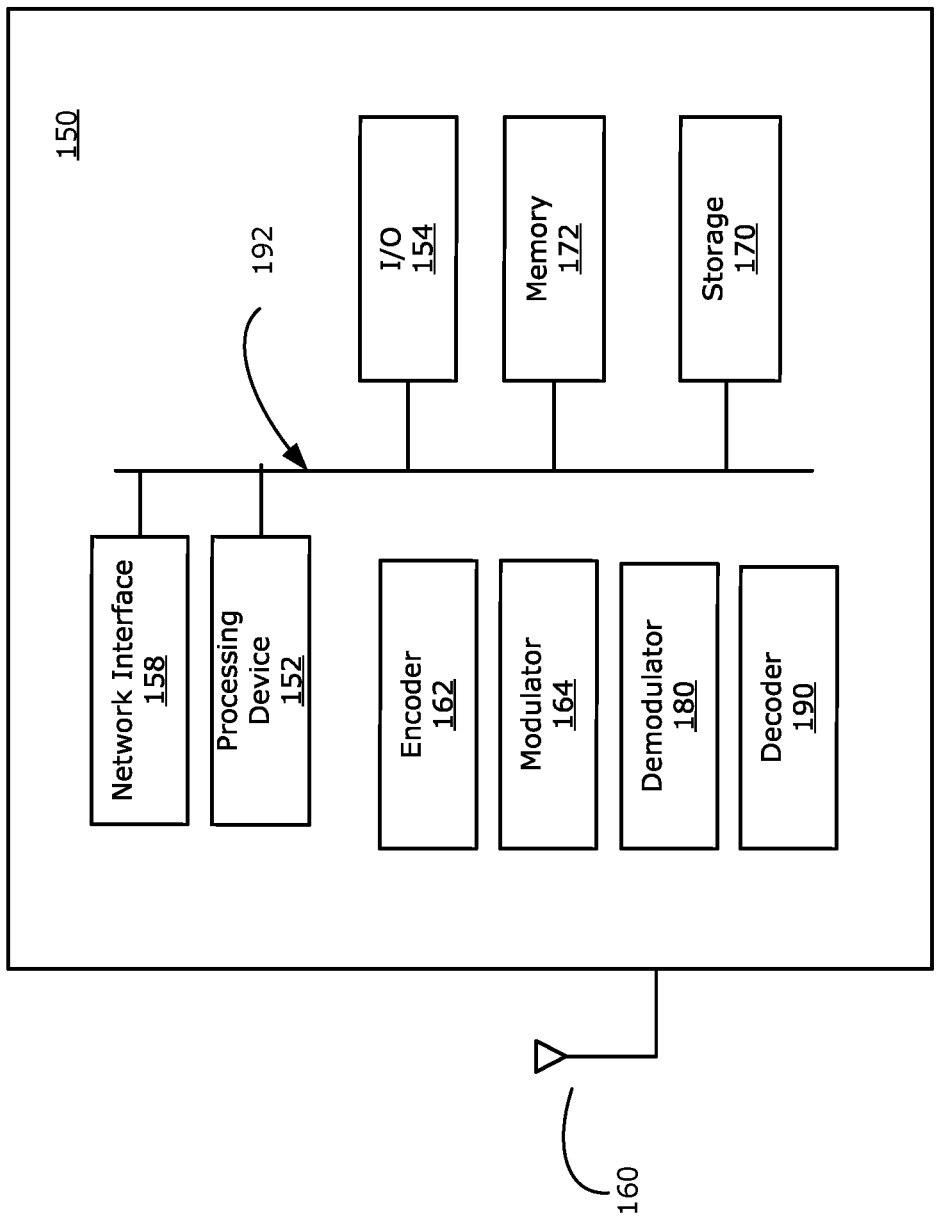
FIG. 2 is a block diagram illustrating an example processing system in accordance with one implementation of the present disclosure.

FIG. 2 illustrates an example processing system 150, which may be used to implement methods and systems described herein, such as the STA 102 or the AP-STA 104. Other processing systems suitable for implementing the methods and systems described in the present disclosure may be used, which may include components different from those discussed below. Although FIG. 2 shows a single instance of each component, there may be multiple instances of each component in the processing system 150.

The processing system 150 may include one or more processing devices 152, such as a processor, a microprocessor, an application-specific integrated circuit (ASIC), a field-programmable gate array (FPGA), a dedicated logic circuitry, or combinations thereof. The processing system 150 may also include one or more input/output (I/O) interfaces 154, which may enable interfacing with one or more appropriate input devices and/or output devices (not shown). One or more of the input devices and/or output devices may be included as a component of the processing system 150 or may be external to the processing system 150. The processing system 150 may include one or more network interfaces 158 for wired or wireless communication with a network. In example embodiments, network interfaces 158 include one or more wireless transceivers that enable communications in a WLAN such as network 100. Network interfaces 158 may also include interfaces for wired or wireless communication with networks, such as but not limited to, an intranet, the Internet, a P2P network, a WAN, LAN, and/or a cellular or mobile communications network such as a 5G NR, 4G LTE or other network as noted above. The network interface(s) 158 may include interfaces for wired links (e.g., Ethernet cable) and/or wireless links (e.g., one or more radio frequency links) for intra-network and/or inter-network communications. The network interface(s) 158 may provide wireless communication via one or more transmitters or transmitting antennas, one or more receivers or receiving antennas, and various signal processing hardware and software, for example. In this regard, some network interface(s) 158 may include respective processing systems that are similar to processing system 150. In this example, a single antenna 160 is shown, which may serve as both transmitting and receiving antenna. However, in other examples there may be separate antennas for transmitting and receiving. The network interface(s) 158 may be configured for sending and receiving data to the backhaul network 110 or to other STAs, user devices, access points, reception points, transmission points, network nodes, gateways or relays (not shown) in the network 100.

The processing system 150 may also include one or more storage units 170, which may include a mass storage unit such as a solid state drive, a hard disk drive, a magnetic disk drive and/or an optical disk drive. The processing system 150 may include one or more memories 172, which may include a volatile or non-volatile memory (e.g., a flash memory, a random access memory (RAM), and/or a read-only memory (ROM)). The non-transitory memory(ies) 172 may store instructions for execution by the processing device(s) 152, such as to carry out the present disclosure. The memory(ies) 172 may include other software instructions, such as for implementing an operating system and other applications/functions. In some examples, one or more data sets and/or module(s) may be provided by an external memory (e.g., an external drive in wired or wireless communication with the processing system 150) or may be provided by a transitory or non-transitory computer-readable medium. Examples of non-transitory computer readable media include a RAM, a ROM, an erasable programmable ROM (EPROM), an electrically erasable programmable ROM (EEPROM), a flash memory, a CD-ROM, or other portable memory storage.

In example embodiments the processing system 150 includes one or more encoders 162 for encoding source words to codewords and a modulator 164 for modulating codewords to symbols. As explained below, the encoder 162 performs LDPC encoding on source words to generate codewords in bits. The modulator 164 performs modulation on the codewords (e.g., by modulation techniques such as BPSK, QPSK, 16QAM, or 64QAM). In some examples, instructions coded in the memory 172 may configure processing device 152 to perform the functions of the encoder 162 and/or the modulator 164, such that the encoder 162 and/or the modulator 164 may not be distinct physical modules of the processing system 150. In some examples, the encoder 162 and the modulator 164 may be embodied within a transmitter module that is part of a network interface 158 of the processing system 150. In some examples, the transmitting antenna 160, the encoder 162, and the modulator 164 may be embodied as a transmitter component external to the processing system 150, and may simply communicate the source words from the processing system 150.

The processing system 150 may include a demodulator 180 and one or more decoders 190 for processing a received signal. The demodulator 180 may perform demodulation on a received modulated signal (e.g., a BPSK, QPSK, 16QAM, or 64QAM signal). The decoder 190 may then perform appropriate decoding on the demodulated signal, in order to recover the original source words contained in the received signal. In some examples, instructions coded in the memory 172 may configure processing device 152 to perform the functions of the demodulator 180 and/or the decoder 190, such that the demodulator 180 and/or the decoder 190 may not be distinct physical modules of the processing system 150. In some examples, the demodulator 180 and the decoder 190 may be embodied within a receiver module of a network interface 158 of the processing system 150. In some examples, the receiving antenna 160, demodulator 180 and decoder 190 may be embodied as a receiver component external to the processing system 150, and may simply communicate the signal decoded from the received signal to the processing system 150.

There may be a bus 192 providing communication among components of the processing system 150, including the processing device(s) 152, I/O interface(s) 154, network interface(s) 158, storage unit(s) 170, memory(ies) 172, encoder 162, modulator 164, demodulator 180 and decoder 190. The bus 192 may be any suitable bus architecture including, for example, a memory bus, a peripheral bus or a video bus.

Figure 3:
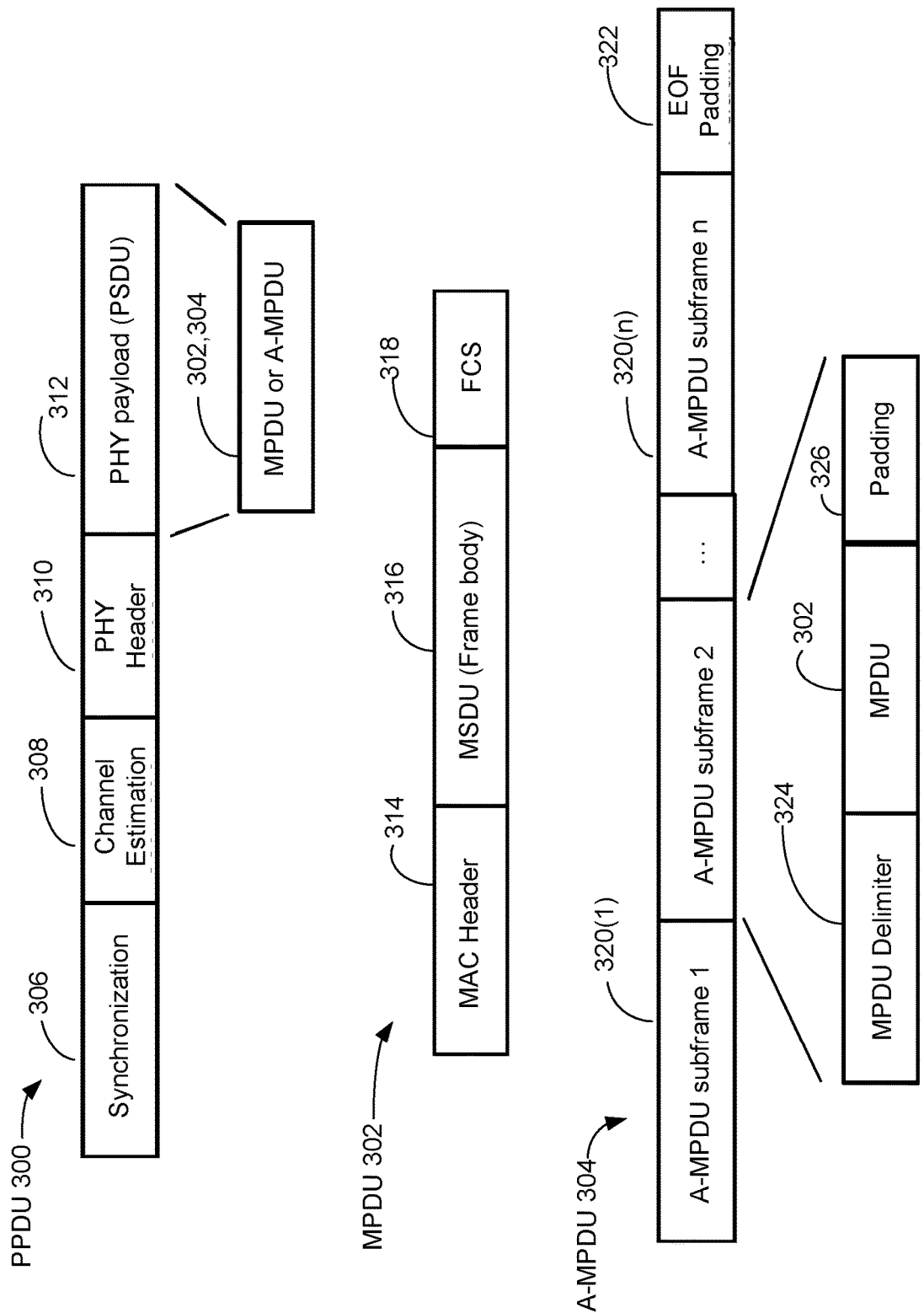
FIG. 3 is a block diagram of an encoding procedure at a source station, according to example embodiments.

FIGS. 3 to 6 will now be described to provide context for example embodiments, described below in respect of FIG. 7 and beyond. Communications between STAs, including for example between a STA 102 and the AP-STA 104, in the network 100 may be implemented by encoding source words using low density parity check (LDPC) encoding techniques to generate codewords. The codewords resulting from LDPC encoding of respective source words are embedded in packets that are modulated and transmitted over a wireless medium between AP-STA 104 and STA 102. In example embodiments, the physical layer packet structure used for communications in network 100 corresponds to a PPDU packet structure, an example of which is shown in FIG. 3. In this regard, the PPDU 300 packet structure can include several fields that respectively include PHY preamble (synchronization information 306 and channel estimation information 308), PHY header information 310, and a PHY payload 312. The PHY payload 312 can be embedded with an encoded MPDU 302 or an A-MPDU 304.

As illustrated in FIG. 3, an MPDU 302 includes respective fields for MAC header information 314, a MAC service data unit (MSDU) 316 and a frame check sequence (FCS) 318. The FCS 318 includes a frame check sequence determined for the combined content of the MAC header information 314 and MSDU 316. An A-MPDU 304 includes multiple MPDUs 302. In particular, an A-MPDU includes A-MPDU subframes 320(1) to 320(n), followed by end of frame padding (EOF) 322. Each A-MPDU subframe 320(i) includes respective fields for an MPDU delimiter 324, MPDU 302, and padding 326.

Figure 4:
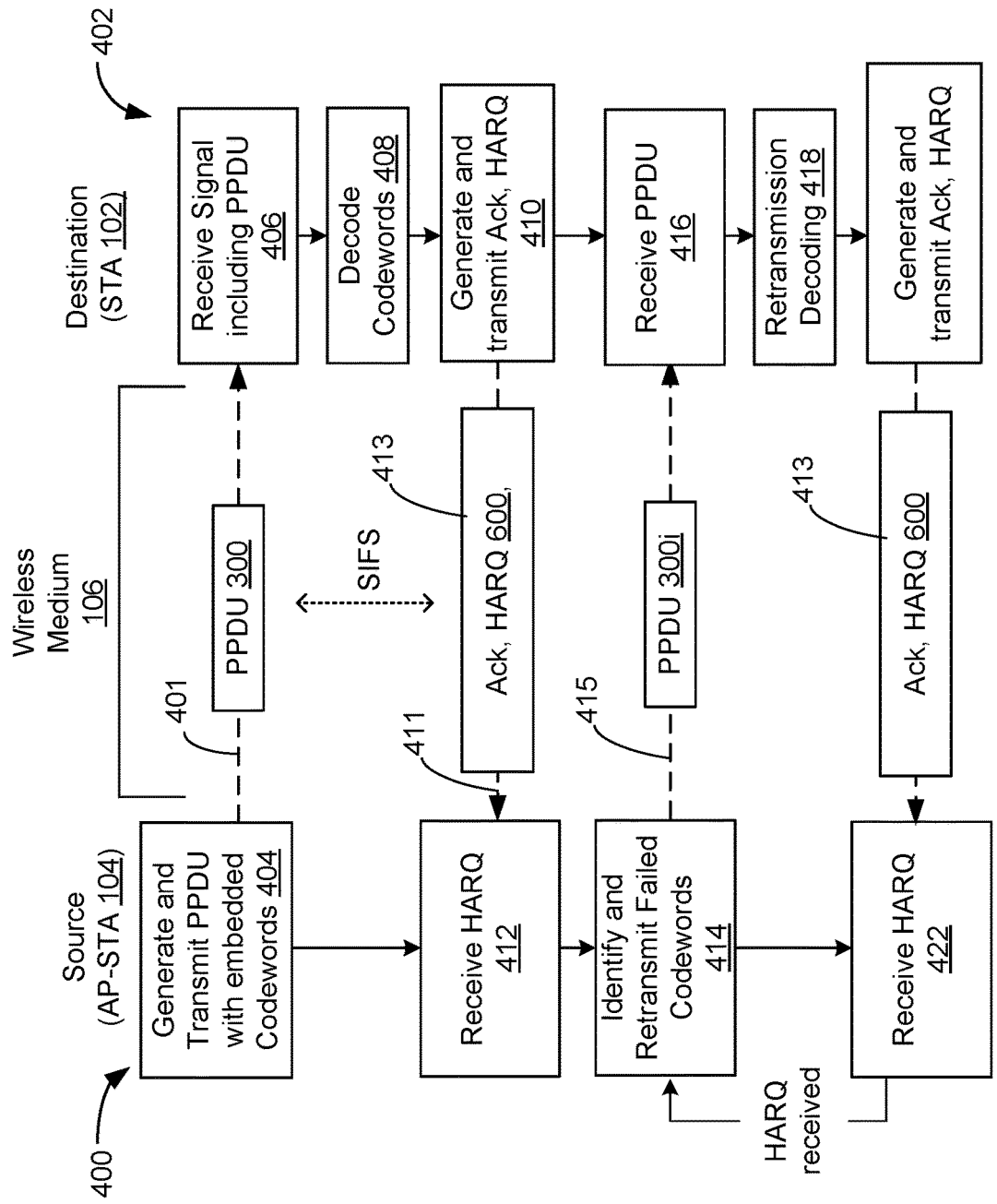
FIG. 4 is a signalling diagram showing signalling between source and destination stations relating to a first transmission of a codeword, feedback and a retransmission of a code word.

FIG. 4 illustrates, according to example embodiments, source actions 400 performed by a source station (for example AP-STA 104) and destination actions 402 performed by a destination station (for example a STA 102), in respect of codewords (included for example in a PPDU 300) transmitted through wireless medium 106. Although AP-STA 104 is illustrated as the source station and STA 102 is illustrated as the destination station in the present example, the roles can be reversed and furthermore, in some embodiments the destination station and source station may be two respective STAs 102 communicating with each other.

Figure 5:
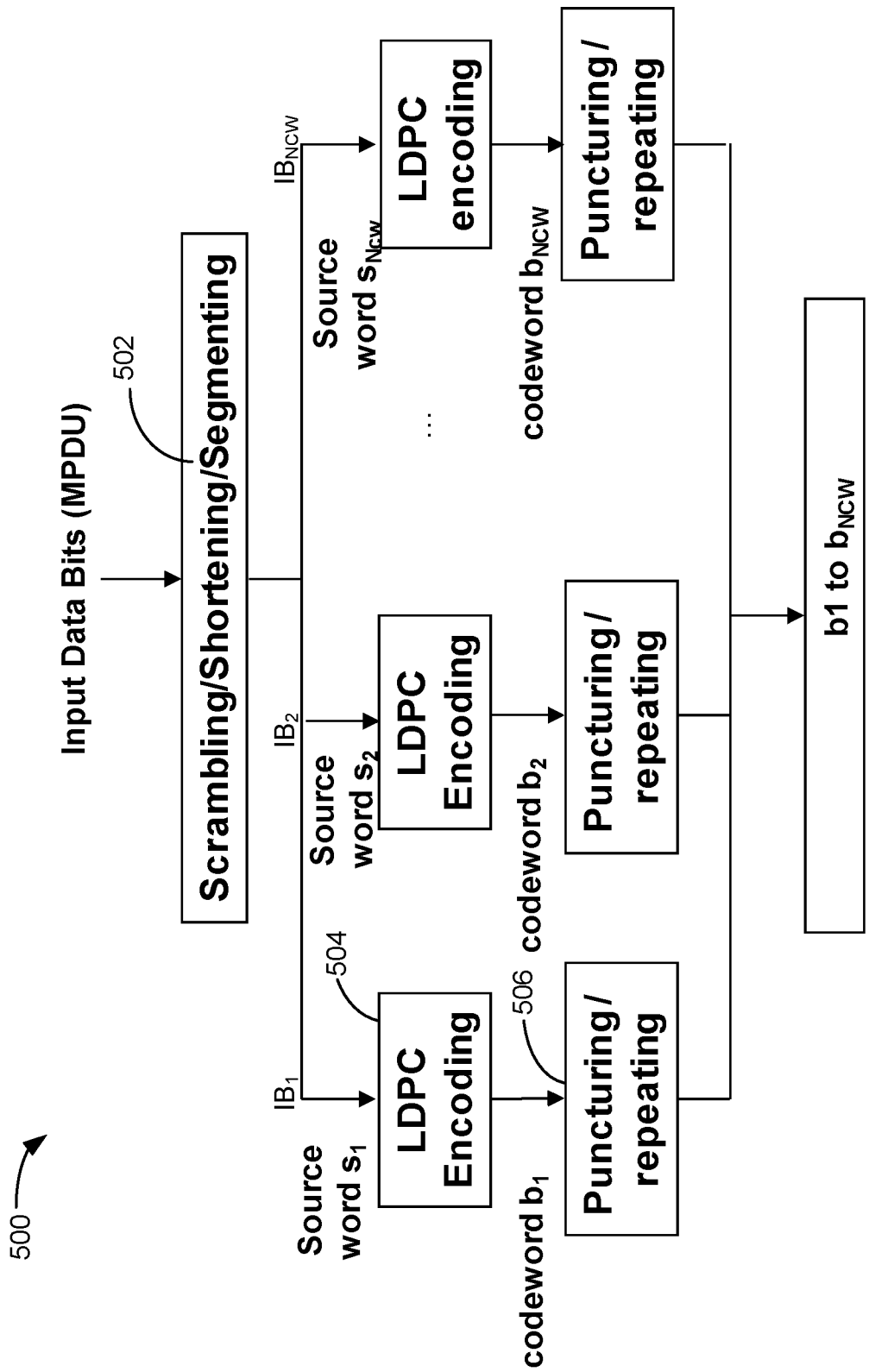
FIG. 5 is a block diagram of an initial codeword transmission encoding procedure at a source station, according to example embodiments.

As illustrated in FIG. 4, AP-STA 104 is configured to generate and transmit a PPDU 300 including one or more sets of LDPC codewords $c_1$ to $c_{NCW}$ (Action 404) which are obtained by LDPC-encoding one or more MPDUs 302. In this regard, FIG. 5 illustrates an example of an encoding procedure 500 for encoding an initial transmission of codewords. Encoding procedure 500 may, for example, be performed at an encoder 162 of the AP-STA 104, for generating a set of NCW codewords $c_1$ to $c_{NCW}$ for inclusion in a PPDU 300). In example embodiments, encoding procedure 500 can be the same as known procedures used to generate LDPC codewords for a PPDU 300 that is compliant with IEEE std 802.11™REVmdD3.2. In this regard, data bits (e.g. the bits that make up MPDU 302, or an A-MPDU 304) are subjected to scrambling, shortening and segmenting operations 502, resulting in a set of information blocks $IB_1$ to $IB_{NCW}$ that are each k-bits in length. In the example of FIG. 5, the information blocks $IB_1$ to $IB_{NCW}$ are used as respective k-bit source words $s_1$ to $s_{Ncw}$ that are each subjected to a respective LDPC encoding operation 504, resulting in respective n-bit codewords $c_1$ to $c_{NCW}$. In the present description, the subscript "j" is used to denote a generic information block $IB_j$, source word $s_j$, and codeword $c_j$ where $1 \le j \le NCW$.

In example embodiments, the LDPC encoding applied in example embodiments uses LDPC codes that are specified in one or more of the IEEE 802.11 protocols, including for example the code rates, codeword block sizes, and parity check matrices specified in IEEE std 802.11™REVmdD3.2.

Accordingly, in encoding procedure 500, the data bits that are to be included in the PSDU 312 of PPDU 300 are segmented into Ncw information blocks $IB_1$ to $IB_{NCW}$, which correspond to Ncw k-bit source words $s_1$ to $s_{NCW}$. Each k-bit source word $s_j$ may be considered as a 1×k row vector or a one-dimensional binary 1×k matrix $s_q=[s_1, \ldots, s_k]$ (1≤q≤NCW). Each k-bit source word $s_q$ is then encoded 504 to respective n-bit systematic codeword $c_q=[c_1, \ldots, c_n]$ by multiplying the source word with a generator matrix G (e.g. $c_q$=s·G). The n-bit codeword $c_q$ includes k information bits and n-k parity check bits. In example embodiments, known procedures for generating LDPC codewords from source words using generator matrix G can be applied to perform LDPC encoding 504. As known in the art, generator matrix G corresponds to a parity check matrix H, and each codeword $b_q$ satisfies the equation: $H \cdot b_q = 0$ IEEE std 802.11™REVmdD3.2 specifies a coding parameters for a number of LDPC codes. A unique parity check matrix (PCM) H is defined for each particular combination of coding rate R and LDPC codeword length N. More particularly, a base PCM Hb is defined for each combination of coding rate R and LDPC codeword length N. The corresponding PCM H is obtained by lifting the base PCM Hb by a lifting factor Z, such that every matrix element in base PCM Hb is replaced with a respective circulant submatrix of size Z×Z. These circulant submatrices are either cyclic permutations of a Z×Z identity matrix or a Z×Z null matrix. Each submatrix element in the base PCM Hb is populated either with a value w (0≤w≤Z) that specifies respective circulant submatrix Pw, or with a null indicator that indicates a null matrix. The value "w" indicates a number of cyclic right shifts that are applied to the Z×Z identity matrix to arrive at submatrix Pw.

Figure 7:
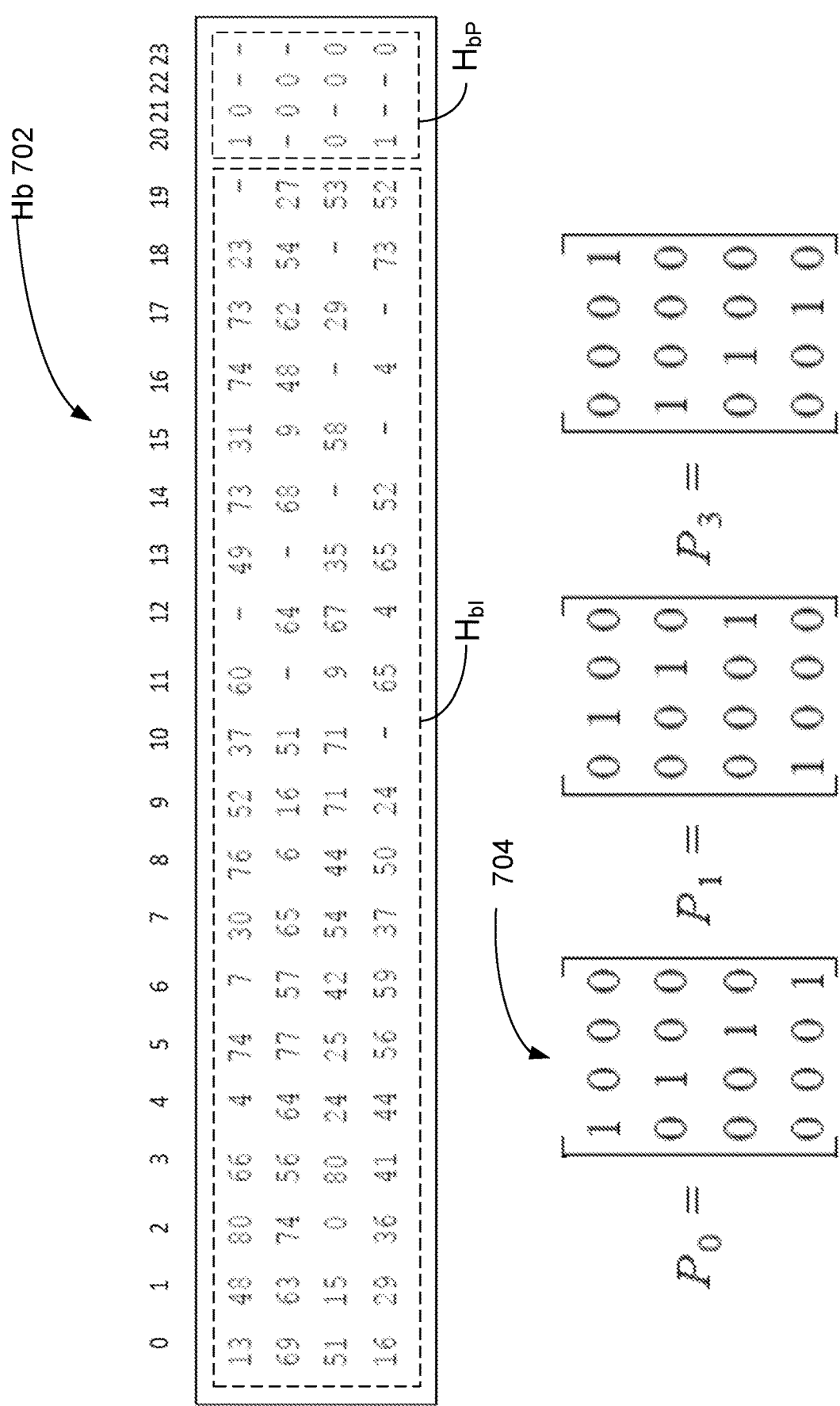
FIG. 7 illustrates an example of base parity check matrix (PCM) Hb (4×24) for coding rate 5/6 LDPC code with n=1944 and Z=81, and an identity matrix together with illustrative cyclic shifted versions for the simplified case where Z=4.

For illustrative purposes, FIG. 7 illustrates the base PCM Hb 702 (4×24) for coding rate 5/6 LDPC code with n=1944 and Z=81. Base PCM Hb 702 can generate a PCM H of size (4*81) rows×(24*81) columns. Each of the array elements in Base PCM Hb 702 indicates either a number w of cyclic right shifts to apply to a 81×81 identity matrix (e.g., element (0,0) specifies 13 cyclic right shifts), or a null matrix (e.g., element (0,12) specifies "–", indicating an 81×81 matrix of zeros). The base PCM Hb 702 includes two parts, namely an information part $H_{bI}$, which has a size of ((nb-kb)×kb)) and a parity part $H_{bP}$, which has a size of ((nb-kb)×(nb-kb)), where kb=k/Z and nb=n/Z).

FIG. 7 also illustrates an identity matrix 704 for the simplified case where Z=4, as well its first cyclic right shift version ($P_1$) and third cyclic version ($P_3$), respectively illustrating examples of w=0, 1 and 3 for Z=4.

Codewords $c_1$ to $c_{NCW}$ may each be subjected to respective puncturing and repeating operations 506, and combined into a bitstream for inclusion in a PPDU 300. The codewords $c_1$ to $c_{NCW}$ in a PPDU 300 are modulated onto an RF signal 401 and transmitted to destination STA 403. As noted above, in some examples, PPDU 300 payload 312 may include a set of codewords generated from a single MPDU 302, and in some examples PPDU 300 payload 312 may include multiple codewords generated from multiple MPDUs 302 aggregated into an A-MPDU 304. The encoding procedure 500 is performed in the same manner as described above to generate a set of codewords for the bits in A-MPDU 304.

Figure 6:
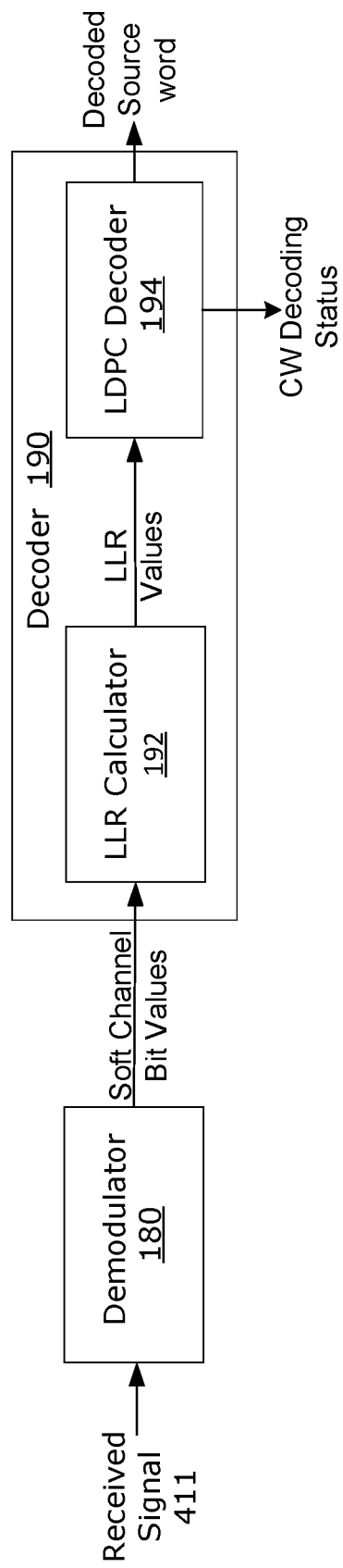
FIG. 6 is a block diagram representing a demodulator and decoder of a destination station, according to example embodiments.

Referring again to FIG. 4, destination STA 102 is configured to receive a signal modulated with the PPDU 300 (Action 406) transmitted by source AP-STA 104 and decode the received codewords $c_1^T$ to $c_{NCW}^T$ embedded in the PPDU 300 (Action 408) (superscript "T" denotes a codeword received at the destination STA 102 after passing through a channel of wireless medium 106). By way of example, FIG. 6 is a block diagram representation of demodulator 180 and decoder 190 of destination STA 102. In example embodiments, the received signal 411 is equalized to reduce intersymbol interference caused by the RF channel, and demodulated by demodulator 180 to generate an initial set of soft channel bit values for each of the codewords $c_1^T$ to $c_{NCW}^T$. Decoder 190 decodes LDPC codewords $c_1^T$ to $c_{NCW}^T$. As known in the art, decoding is performed based on the parity check matrix (PCM) H and Tanner graph corresponding to the generator matrix G applied at the transmitting source to generate LPDC codewords $c_1$ to $c_{NCW}$. In this regard, Decoder 190 includes a log-likelihood ratio (LLR) calculator 192 that is configured to calculate LLR values for each of the soft channel bits of a codeword $c_q^T$, which are initially assigned to the corresponding variable nodes of the Tanner graph during the decoding. An LDPC decoder 194 then applies an iterative message passing algorithm (MPA) based on the log-likelihood ratio (LLR) values to either successfully decode the codeword $c_q^T$ and recover the source word $s_j$, or determine that the codeword $c_q^T$ cannot be successfully decoded. As known in the art, a received codeword $c_q^T$ is determined to be valid (e.g. successfully decoded) if the codeword $c_q^T$, after decoding, can satisfy $H \cdot b_j^T = 0$. In example embodiments, decoder 190 provides a decoding status for each of the codewords $c_1^T$ to $c_{NCW}^T$ in the received PPDU 300, based on the validity of each codeword after decoding. In particular, the decoding status for each codeword $c_1^T$ to $c_{NCW}^T$ can be either: (a) successfully decoded or (b) unsuccessfully decoded.

As noted above, each set of codewords $c_1^T$ to $c_{NCW}^T$ corresponds to a MPDU 302, and thus the recovered source words obtained from decoding the codewords $c_1^T$ to $c_{NCW}^T$ correspond to the bits of an MPDU 302, which as indicated above includes a MAC header 314, an MSDU 316, and an FCS 318. In example embodiments, the decoder 190 is configured to determine a decoding status for the MPDU 302 based on whether an FCS calculated at the destination STA 102 in respect of the bits of the recovered MAC header 314 and MSDU 316 bits matches the recovered FCS 318. Accordingly, in example embodiments, decoder 190 provides a decoding status for MPDU 302 recovered from the received PPDU 300, along with the a decoding status for each of the codewords $c_1^T$ to $c_{NCW}^T$ that correspond to each MPDU 302.

In example embodiments, the destination STA 102 is configured to store the interim and final decoding results for any codewords $c_1^T$ to $c_{NCW}^T$ that are unsuccessfully decoded and thus labelled as unsuccessfully decoded. By way of example, destination STA 102 may provide a codeword decoding log that identifies, for each unsuccessfully decoded codeword $c_q^T$, one or both of: the soft channel bit values output by demodulator 180; and the LLR values output by LLR calculator 192. The soft bit LDPC decoding values generated during the iterations of the MPA performed by LDPC decoder 194 may also be stored. As described in greater detail below, in example embodiments, these values can be combined with corresponding values generated in respect of retransmitted codewords to assist in decoding of the retransmitted codewords.

Referring again to FIG. 4, in example embodiments, as indicated in Action 410, the destination STA 102 is configured to generate and send a feedback message 413 modulated on an RF signal 411 back to the source AP-STA 104 after a SIFS duration following the transmission of PPDU 300. In example embodiments, the type of feedback message 413 sent and the content of the feedback message 413 are based on a determination of whether (i) the decoding results are completely successful, or (ii) the decoding results include some errors. Accordingly, in some example embodiments, if the FCS decoding status for all MPDUs 302 indicates successful decoding, the destination STA 102 is configured to send a feedback message 413 using an ACK frame format that will be interpreted by the source AP-STA 104 as indicating complete decoding success.

In some examples, in the case where the FCS decoding status in respect of at least one MPDU indicates that an error has occurred, the feedback message 413 uses a HARQ frame format to provide a negative acknowledgement HARQ message 600 to the source AP-STA 104. In example embodiments, the HARQ message 600 includes a "CW Bitmap". The CW Bitmap is used to specify the decoding status for each received codeword $c_1^T$ to $c_{NCW}^T$. For example, each received codeword $c_1^T$ to $c_{NCW}^T$ can have a respective bit location allocated to it in the CW Bitmap, with a bit value of "1" in the location allocated to a codeword $c_q^T$ indicating that the codeword $c_q^T$ has been successfully decoded and a bit value of "0" in the location allocated to a codeword $c_q^T$ indicating that the codeword $c_q^T$ has been unsuccessfully decoded. For example, a 6 octet "CW Bitmap" field that includes 48 bits allows the decoding status for up to 48 codewords to be indicated (e.g., corresponding to NCW≤48).

In some example embodiments, the source station AP-STA 104 and destination station STA 102 may be configured to also use a HARQ message instead of an Ack frame to indicate a completely successful decoding. In such cases, CW Bitmap field of the HARQ message 600 will be set to indicate a successful decoding for all received codewords. Accordingly, in example embodiments, a HARQ message can function as an Ack frame (e.g. CW Bitmap set to indicate all codewords are successfully decoded) or alternatively as a Nack Frame (e.g. at least some bits in CW Bitmap indicate unsuccessfully decoded codewords).

In the case of a PPDU 300 that includes an A-MPDU 304 having MPDUs 302, HARQ message 600 may take the form of a BlockAckCW message, which may include CW Bitmap subfields for each of the MPDUs.

Referring again to FIG. 4, and in particular to source actions 400 performed at source AP-STA 104, after transmitting the PPDU 300 the source AP-STA 104 is configured to wait for a feedback message 413 (e.g., HARQ or Ack) In example embodiments, if the feedback message 413 is not received within the time-out period, the source AP-STA 104 determines that the transmission of PPDU 300 was a complete failure and returns to Action 404 to retransmit the entire PPDU 300 over again as an initial transmission.

In example embodiments, if the feedback message 413 is received before the expiration of the time-out period is an Ack frame (or a HARQ frame indicating a completely successful decoding) no data retransmission is required. Otherwise, the source AP-STA 104 is configured to identify, based on CW bitmap(s) included in the feedback message 413 which codewords were unsuccessfully decoded at the destination STA 102 and then retransmit information about the unsuccessfully decoded codewords (or versions of the incorrectly codewords) in a new PPDU 300R (Action 414). Retransmission procedures carried out as part of Action 414 will now be described in greater detail according to some example embodiments.

In at least some example embodiments, the retransmission procedures performed by the source AP-STA 104 to retransmit unsuccessfully decoded codewords and the subsequent decoding procedures performed at destination STA 102 are configured to increase the chance of success based on information known from the failed transmission. In example embodiments the retransmission procedures performed by the source AP-STA 104 to retransmit unsuccessfully decoded codewords rely on IR-HARQ. In particular, IR-HARQ codes are proposed that build on existing LPDC codes, thereby enabling backwards compatibility.

A retransmission procedure carried out as part of Action 414 by AP-STA 104 will now be described in respect of a failed codeword $c^T_q$, with reference to FIG. 8. Failed codeword $c^T_q$ corresponds to a sourceword $s_q$. In the initial transmission (e.g., in PPDU 300 transmitted as part of Action 402), the sourceword $s_q$ that is LDPC encoded is identical to the information block $IB_j$ that results from rescrambling, shortening and segmenting operations 502. As will be described below, for each successive retransmission AP-STA 104 is configured to perform an encoding process 802(*i*) (where $1 \le i \le R_{max}$, and $R_{max}$ denotes a maximum number of retransmissions). encoding process 802(*i*) includes a permutation operation 804, a shortening operation 806 and LDPC encoding operation 504. Permutation operation 804 and shortening operation 806 are performed on the information block $IB_q$ that corresponds to failed codeword $c^T_q$ to generate a permutated, shortened sourceword $s'_{q(i)}$ that is then LDPC encoded according generator matrix G of LDPC encoding operation to generate a respective permuted extension codeword c'q(i). Each encoding process 802(*i*) ($1 \le i \le R_{max}$) retransmission corresponds to a further extension being added to the initially transmitted LDPC codeword $c_{q(0)}$, and accordingly i also denotes the number of times an LDPC code has been extended.

Figure 8:
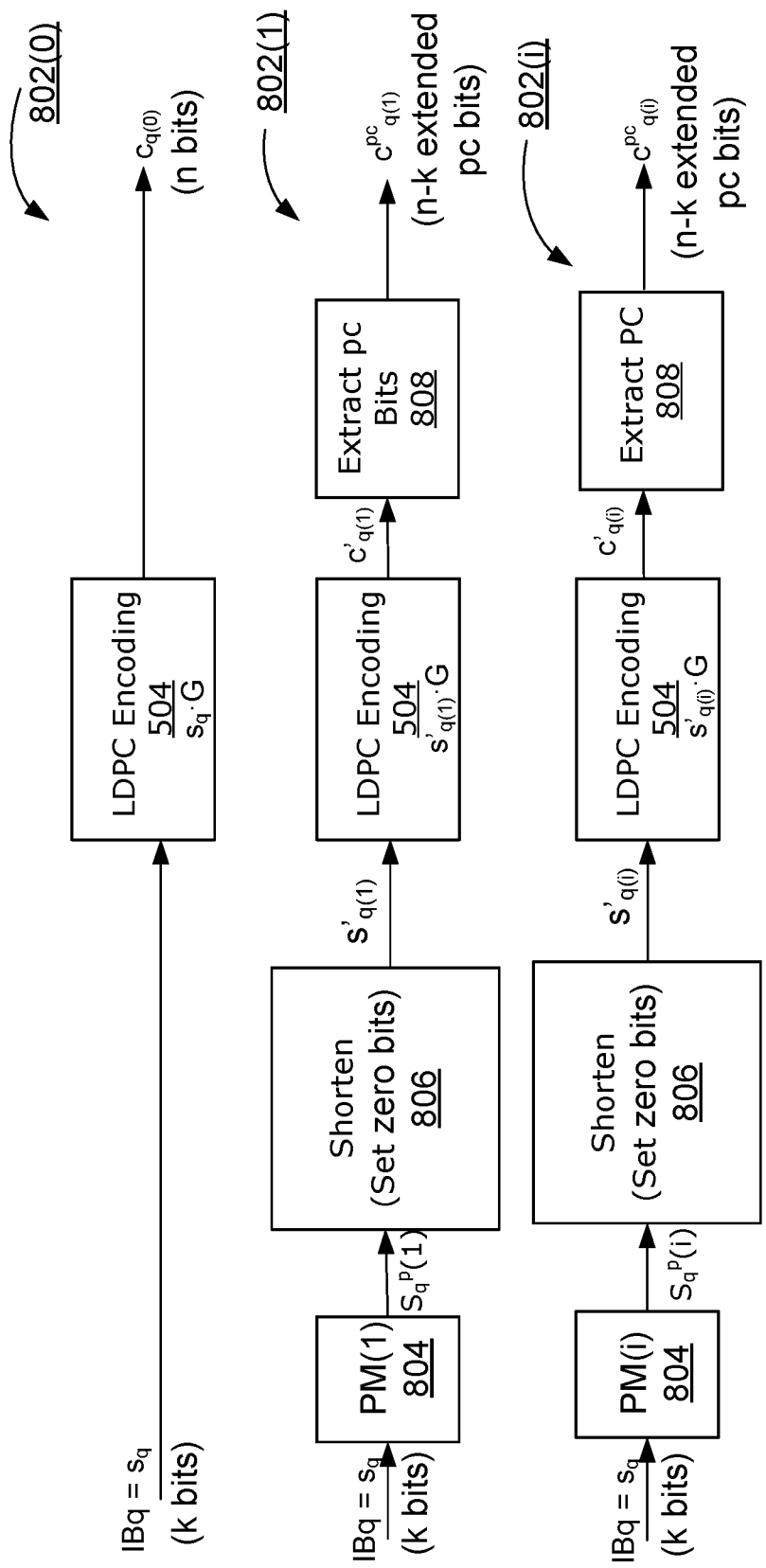
FIG. 8 illustrates a plurality of LDPC encoding processes according to example embodiments.

In FIG. 8, encoding process 802(0) corresponds to the LDPC encoding operation 504 performed on original length k information block $IB_q$ (i.e., sourceword $s_q$) to generate length n codeword $c_q$ during for the initial transmission (i=0). Encoding process 802(1) and 802(*i*) correspond to the encoding operations performed in respect of information block $IB_q$ to generate a first extension codeword $c'_{q(1)}$ and a $i^{th}$ extension codeword $c'_{q(i)}$ for a first IR-HARQ transmission and an ith IR-HARQ transmission, respectively.

As indicated in FIG. 8, encoding process 802(0) performs LDPC encoding by multiplying source word $s_q$ (corresponding to information block $IB_q$) with initial transmission a generator matrix G. Generator matrix G corresponds to original transmission PCM matrix H (hereinafter referred to as PCM matrix H(0)), which as noted above is derived from lifting a base PCM matrix $H_b$ (hereinafter referred to as base PCM matrix $H_b$(0)).

Each extension encoding process 802(*i*) (i>0), is configured to generate a respective codeword $c'_{q(i)}$ that corresponds to the output of a respective generator matrix G(i) that for a respective PCM matrix H(i) that is an $i^{th}$ extension of the original transmission PCM matrix H(0). In example embodiments, the identical encoding operation 504 (i.e., the same generator matrix G) is applied in each of the extension coding processes 802(*i*). Accordingly, permutation operation 804 and shortening operation 806 are configured to rearrange and shorten the information bits included in original information block $IB_q$ to provide a permuted and shortened source word $s'_{q(i)}$ that, when multiplied by generator matrix G, will result in an extended codeword $c'_{q(i)}$ that is the equivalent of original source word $s_q$ (i.e., $IB_q$) multiplied by a respective generator matrix G(i) that corresponds to the respective PCM matrix H(i) that is an $i^{th}$ extension of the original transmission PCM matrix H(0). Stated another way, $c'_{q(i)} = s_q \cdot G(i) = s'_{q(1)} \cdot G$.

In example embodiments, PCM matrix H(i) corresponds to a predefined permutation and shortening map PM(i). In particular, a set of permutation and shortening maps PM(i), ($1 \le i \le R_{max}$) is predetermined for each base LDPC code that can be used for an initial transmission. As noted above, IEEE std 802.11™REVmdD3.2 that specifies a unique base PCM $H_b$ (referred to hereafter as base PCM $H_b$(0)) for each particular combination of coding rate R and LDPC codeword length N. In example embodiments, a set of $R_{max}$ permutation and shortening map s {PM(1), . . . , PM($R_{max}$)} is defined for each base PCM $H_b$, thereby defining a respective a family of $R_{max}$ extension base PCMs {$H_b$(1) to $H_{b(R_{max})}$}.

In FIG. 8, LDPC codeword $c_{q(o)}$ corresponds to a mother LDPC code generated based on PCM H(0), and LDPC codeword {$c'_q$(i), . . . , $c'_{q(R_{max})}$} correspond to respective extension LDPC codes generated based on PCMs {$H_b$(1) to $H_{b(R_{max})}$}, which are each derived from PCM $H_b$(0). In example embodiments, permutation and shortening maps are stored in a memory of AP-STA 104.

Figures 9, 10:
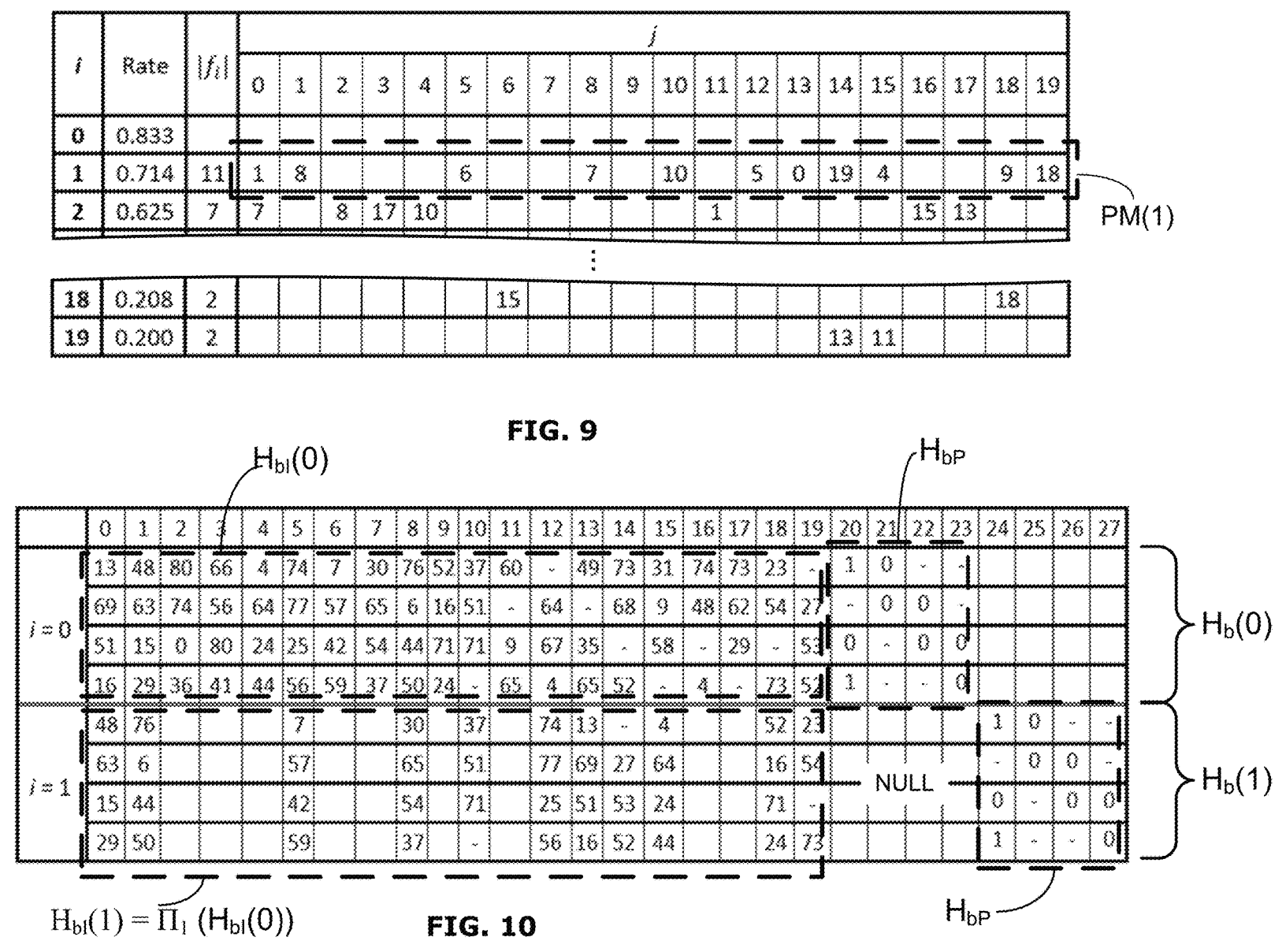

By way of illustrative example, FIG. 9 illustrates selected rows from a table that defines a set of $R_{max}$=19 permutation and shortening map s {PM(1), . . . , PM(19)} that correspond to base PCM $H_b$ (4×24) for coding rate 5/6 LDPC code with n=1944 and Z=81. Each of the rows i=1 to 19 corresponds to a respective permutation and shortening map PM(1), . . . , PM(19). FIG. 10 shows an example of original PCM $H_b$(0) (e.g., as specified in IEEE std 802.11™REVmdD3.2 and illustrated above in FIG. 7)), and i=1 extension PCM $H_b$(1) as defined by permutation and shortening map PM(1). As noted above, the base PCM Hb(0) includes two parts, namely an information bit part $H_{bI}$(0) which has a size of ((nb–kb)×kb)) and a parity bit part $H_{bP}$ which has a size of ((nb–kb)×(nb–kb)), where kb=k/Z and nb=n/Z). As can be seen in FIG. 10, the base PCM Hb(1) includes three parts, namely an information bit part $H_{bI}$(1) which has a nominal size of ((nb–kb)×kb)), a null part (corresponding to the location of parity bit part $H_{bP}$(0) in the original PCM $H_b$(0)) and a parity bit part $H_{bP}$ which has a size of ((nb–kb)×(nb–kb)). The information bit part $H_{bI}$(1) of base PCM Hb(1) is generated by applying a permutation function $\Pi_1$, and a shortening function $\Lambda$ to select a subset of permuted columns obtained from the original PCM PCM $H_b$(0) through permutation operation which is defined by permutation and shortening map PM(1), to the original base information part $H_{bI}$(0). The shortened columns in $H_{bI}$(1) after shortening operation are set to be null columns. The parity bit part $H_{bP}$ of PCM Hb(1) is generated by right-column shifting the parity bit part $H_{bP}$ of the original PCM Hb(0) by (nb–kb) columns, resulting in an extension to the matrix and a set of (nb–kb) null columns.

The table shown in FIG. 10 can collectively be represented as:

$$H_b = \begin{bmatrix} H_{bI}(0) & H_{bP} & 0 \\ \Pi_1 \Lambda(H_{bI}(0)) & 0 & H_{bP} \end{bmatrix}$$

where the first row of matrix $H_b$ denotes original PCM $H_b$(0) and the second row of denotes first extension PCM $H_b$(1).

In the table of FIG. 9, "fi" denotes a set of column indices that maps a respective column j ($0 \le j \le (kb-1)$) in the original base information part $H_{bI}$(0) to a column j in the ith extension information part $H_{bI}$(i). |fi| denotes the number of columns that a mapping is performed in respect of, with the remaining being populated with zeros. Thus, each row in FIG. 9 specifies a permutation by providing, in a column location corresponding to the permutated code, a number that maps to a column corresponding to the original base information part $H_{bI}(0)$. A shortening pattern $\Lambda_1$ is specified by the column locations that are left blank. Accordingly, in the case of column indices set "f1" as defined by permutation and shortening map PM(1), the first extension information part $H_{bI}(1)$ is reduced to:

$$f_1=\{f_1(j)\}=\{f_1(0),f_1(1),f_1(5),f_1(8),f_1(10),f_1(12),f_1(13),f_1(14),f_1(15),f_1(18),f_1(19)\}$$

Where: $H_{bI}(0)$ Column j=0 is mapped to $H_{bI}(1)$ Column j=13

$H_{bI}(0)$ Column j=1 is mapped to $H_{bI}(1)$ Column j=0
$H_{bI}(0)$ Column j=4 is mapped to $H_{bI}(1)$ Column j=15
$H_{bI}(0)$ Column j=5 is mapped to $H_{bI}(1)$ Column j=12
And so on for a total of |f1|=11 mapped columns.

It will be noted that Kb−|f1| columns $H_{bI}(0)$ are not mapped to $H_{bI}(1)$. The columns of $H_{bI}(1)$ that do not have a corresponding mapping to $H_{bI}(0)$ are null columns and populated with zeros.

As noted above, in example embodiments the original generator matrix G is applied at LDPC encoding operation 504 in each extension encoding process 802(i) (i>0), and accordingly the source word $s_q$ must be manipulated by permutation operation 804 and shortening operation 806 to enable the extension encoding process 802(i) to output the equivalent of an LDPC encoding operation that applies a unique generator matrix that corresponds to extension PCM H(i).

In this regard, the permutation operation 804 of extension encoding process 802(i) (i>0) is configured to rearrange the information bits in source word $s_q$ to generate a permuted sourceword $S_q^P(i)$ according to the permutation and shortening map PM(i) that defines information bit part $H_{bI}(i)$ of base PCM Hb(i). In example embodiments, the set of $R_{max}$ permutation and shortening map s $\{PM(1), \ldots, PM(R_{max})\}$ that are defined for each base PCM $H_b$ define a respective set of permutations $\Pi_1$ to $\Pi_{Rmax}$ and a respective set of shortening patterns $\Lambda_1$ to $\Lambda_{Rmax}$ that can be respectively applied by the permutation operations 804 and shortening operations 806 of the LDPC encoding processes 802(1) to 802($R_{max}$). Each permutation and shortening map PM(i) defines sets of bits of the source word $s_q$ for inclusion in permuted and shortened sourceword $S_q^P(i)$, and the order and location of the sets of bits in the permuted and shortened sourceword $S_q^P(i)$. The bits which are indicated by the permutation and shortening map PM(i) to be shortened in sourceword $S_q^P(i)$ are set to zero.

Reference is again made to FIG. 9 and example permutation and shortening map PM(1). In example embodiments, the index values in the table row corresponding to permutation and shortening map PM(i) map to a respective set of Z bits in the original source word $S_q$ and the location of the index values in the table row indicate where those Z bits should be located in permuted sourceword $S_q^P(i)$.

For example, in the case of permutation and shortening map PM(1), the index value "1" aligned under index column j=0 indicates that the $1^{st}$ set of Z bits of the permuted sourceword $S_q^P(i)$ are to be populated by copying the $2^{nd}$ set of Z bits from original sourceword $s_q$. Accordingly, |f1| sets of Z bits from original sourceword $s_q$ are copied into specified Z-bit locations of the permuted sourceword $S_q^P(i)$. As only |f1|×Z information bits are copied, permuted sourceword $S_q^P(i)$ includes k−(|f1|×Z) undefined elements. These undefined elements are all set to zero in shortening operation 806, resulting in permuted shortened sourceword $S'_q(i)$. $S'_q(i)$ is then multiplied by original generator matrix G to generate resulting extension codeword $c'_{q(i)}$, which includes |f1|×Z information bits located throughout a set of k bits, and n−k extension parity check bits. In example embodiments, the n−k extension parity check bits are extracted by an extraction operation to output parity check extension codeword $c^{pc}_{q(i)}$.

The retransmission encoding process shown in FIG. 8 can be applied in respect of a plurality of different failed codewords. Extension codeword $c^{pc}_{q(i)}$ can be included in a retransmission PPDU 300R. Referring again to FIG. 4, the source AP-STA 104 is configured to modulate retransmission PPDU 300R onto an RF signal 415 for transmission through a channel of wireless medium 106.

As indicated in Action 422, AP-STA 104 may receive a further HARQ message 413 from destination STA 102 indicating that another retransmission required in respect of a repeat failed codeword $c^T_q$. In such case, a further LPDC extension can be generated using the next PCM permutation and shortening map PM(i).

The information that is included in an retransmitted codeword $c_{q(i)}$ included in retransmission PPDU 300R may be different in different applications and embodiments. As noted above, the destination STA 102 is configured to store the interim and final decoding results for any codewords $c_j^T$ that are unsuccessfully decoded and thus labelled as unsuccessfully decoded. The LPDC coding scheme is systematic such that the destination STA 102 can combine information from the original codeword transmission with the extension information received in subsequent retransmissions.

In a first example embodiment, a retransmitted codeword $c_{q(i)}$ may include only the n−k parity check bits of $c^{pc}_{q(i)}$ (e.g.: retransmitted codeword $c_{q(i)}$=parity check extension codeword $c^{pc}_{q(i)}$). In such cases, the receiving destination STA 102 combines the newly received n−k parity check bits of $c^{pc}_{q(i)}$ with the information bits and the parity check bits it previously received in the original transmission and any intervening retransmissions. In such an embodiment, an n-bit long codeword $c_q$ is transmitted in the original transmission, with a respective n−k bit length parity check bit extension codeword $c^{pc}_{q(i)}$ being subsequently transmitted in each retransmission. This embodiment is an efficient transmission approach in terms of spectrum efficiency in IR-HARQ. If it is desired to keep the length of the retransmitted codeword $c_{q(i)}$ the same length as the original codeword $c_q$ for packet encoding, in some examples this can be accomplished by repeating the extension codeword $c^{pc}_{q(i)}$ in the retransmission packet to pad it out to length n.

In a second example embodiment, the retransmitted codeword $c_{q(i)}$ includes the information bits of the original codeword $c_q$ combined with the n−k parity check bits of extension codeword $c^{pc}_{q(i)}$. In this case, the information bits are retransmitted, along with the new parity check bits, resulting an n-bit long codeword. In this way, the code block length is unchanged during the initial transmission and each retransmission.

In a third example embodiment, the retransmitted codeword $c_{q(i)}$ includes the non-zeroed information bits generated by the LDPC encoding operation 504, as well as the n−k parity check bits of extension codeword $c^{pc}_{q(i)}$. Accordingly, in such a case some of the information bits are retransmitted in a permuted from.

Destination STA 102 is configured to receive and demodulate RF signal 415 (Action 416) to recover soft channel bit values for retransmitted codeword $c_{q(i)}$ included in the retransmission PPDU 300R, which are then subjected to a retransmission decoding procedure 418. The actions taken during retransmission decoding procedure 418 in respect of a retransmitted codeword $b'_j{}^T$ are illustrated in FIG. 11 in accordance with the example embodiment noted above in which the retransmitted codeword $c_{q(i)}$ includes only the n-k parity check bits of $c^{pc}_{q(i)}$ (e.g.: retransmitted codeword $c_{q(i)}$=parity bit check extension codeword $c^{pc}_{q(i)}$).

Figure 11:
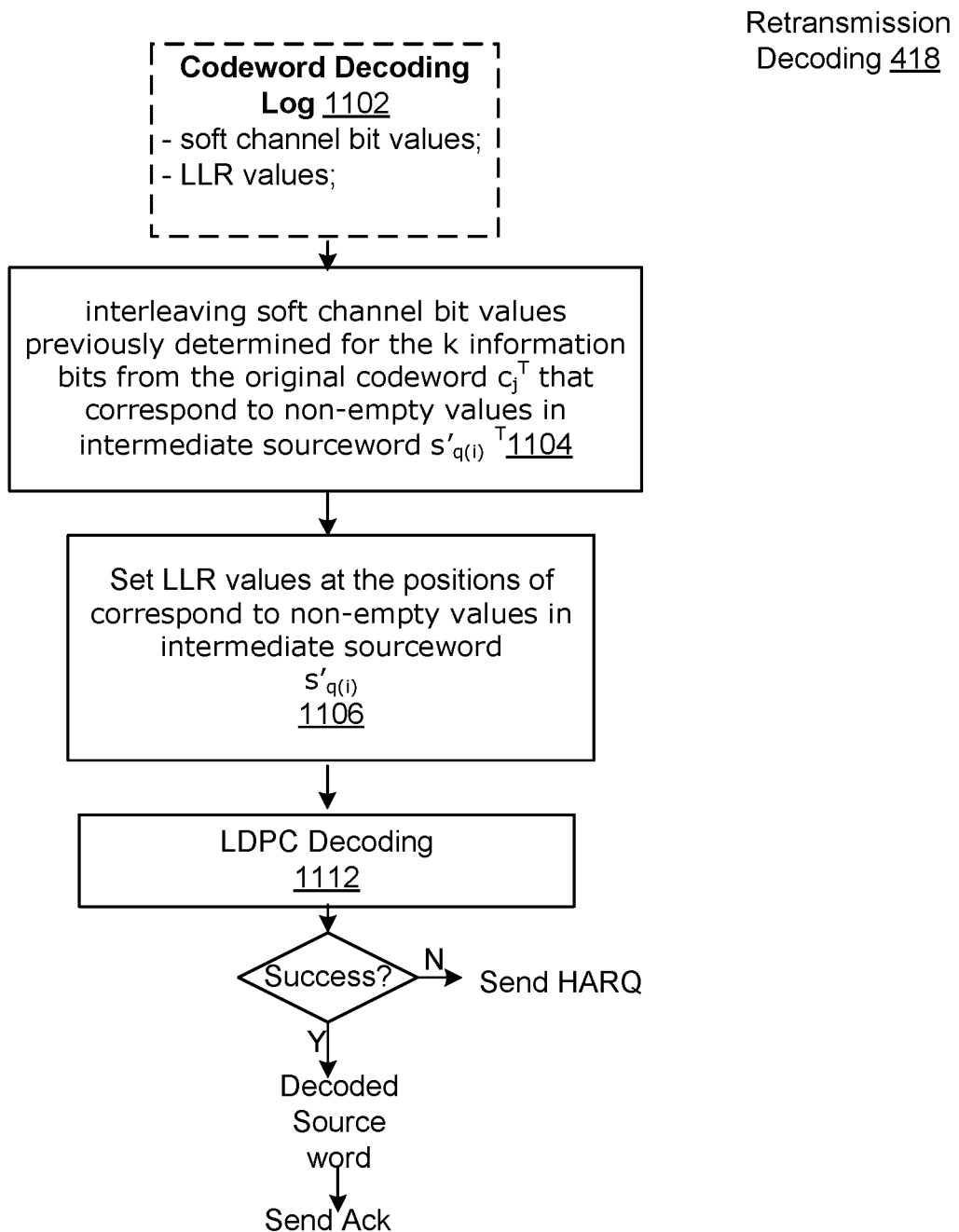
FIG. 11 is flow chart of a retransmission decoding process, according to example embodiments.

As indicated in FIG. 11, destination STA 102 includes a codeword decoding log 1102 that includes decoding results for unsuccessfully decoded codewords $b^T$ from the original PPDU transmission. The codeword decoding log 1102 may for example identify, for each unsuccessfully decoded codeword $c_j^T$: the soft channel bit values output by demodulator 180 and the LLR values output by LLR calculator 192. In example embodiments, the values included in codeword decoding log 1102 are available for combining with values generated in respect of retransmitted codewords to assist in decoding of the retransmitted codewords. In at least some example embodiments where multiple retransmissions occur, the codeword decoding log 1102 can provide retransmission values as well as the original transmission values associated with codewords.

Accordingly, in the example retransmission decoding procedure 418 shown in FIG. 11, retransmission decoding 418 begins with interleaving the soft channel bit values previously determined for the k information bits from the original codeword $c_j^T$ that correspond to non-empty values in intermediate sourceword $s'_{q(i)}$ (Action 1104). The LLR values are then set, based on decoding log, at the codeword positions the correspond to empty values in intermediate sourceword $s'_{q(i)}$ (Action 1106). LDPC decoding is performed based on the LLR values (Action 1112).

Figure 12:
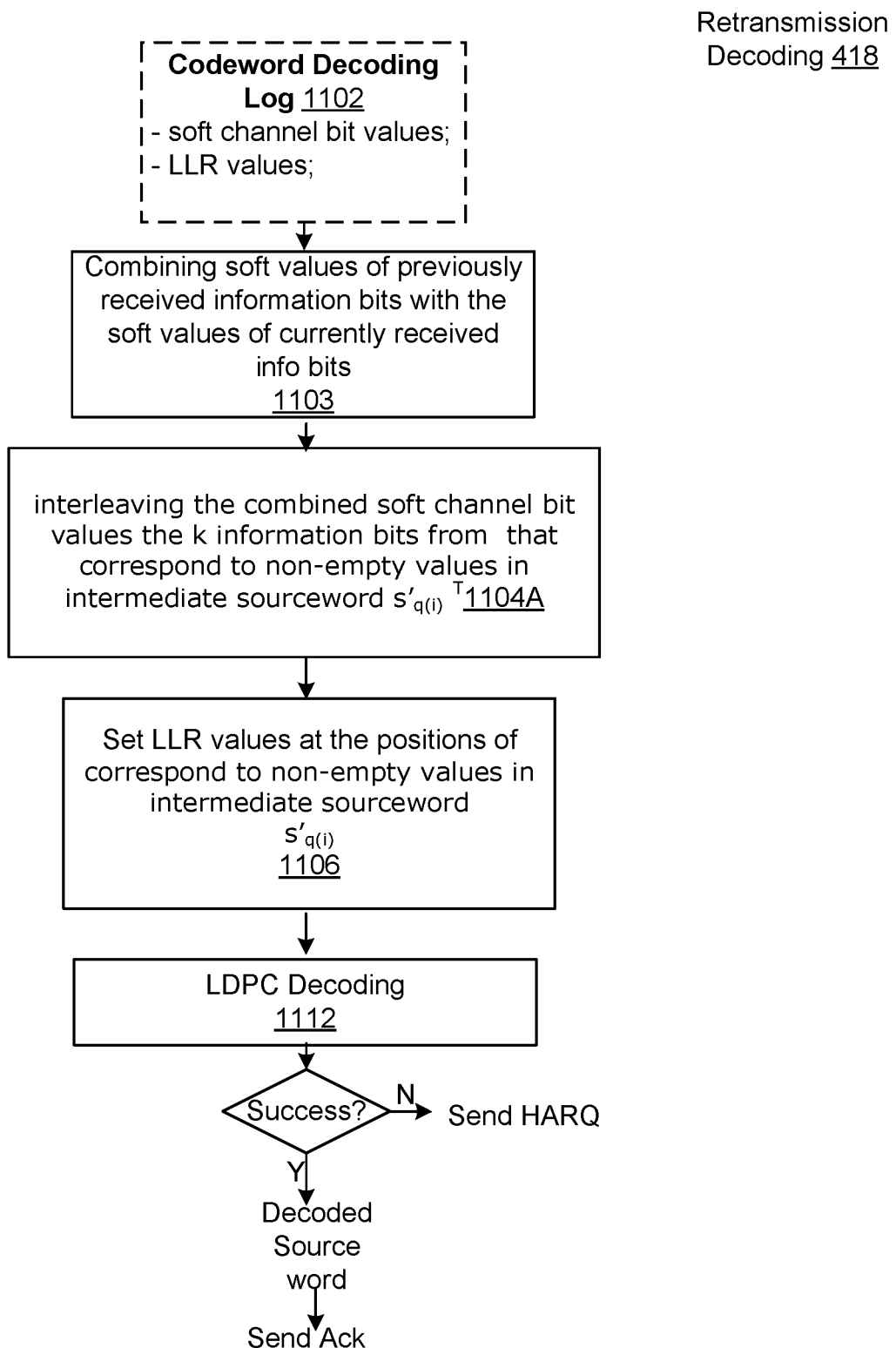
FIG. 12 is a flow chart of a retransmission decoding process, according to example embodiments.

FIG. 12 illustrates actions taken during retransmission decoding procedure 418 in respect of a retransmitted codeword $b'_j{}^T$ in accordance with the example embodiment noted above in which the retransmitted codeword $c_{q(i)}$ includes the information bits as well as the new n-k parity check bits of $c^{pc}_{q(i)}$ (e.g.: retransmitted codeword $c_{q(i)}$=codeword $c'_{q(i)}$). In such case an additional step can be included beyond that shown in FIG. 11, namely combining soft values of previously received information bits with the soft values of currently received information bits in retransmitted codeword $c_{q(i)}$ (Action 1103). Furthermore, Action 1104 is amended to interleaving the combined soft channel bit values the k information bits from that correspond to non-empty values in intermediate sourceword $s'_{q(i)}$ (Action 1104A).

As noted above, in example embodiments a set of permutation and shortening map s PM(i), (1≤i≤Rmax) is predetermined for each base LDPC code that can be used for an initial transmission, and IEEE std 802.11™REVmdD3.2 that specifies a unique base PCM Hb (referred to hereafter as base PCM Hb(0)) for each particular combination of coding rate R and LDPC codeword length N. In example embodiments, a set of Rmax permutation and shortening map s {PM(1), . . . , PM(Rmax)} is defined for each base PCM Hb, thereby defining a respective a family of Rmax extension base PCMs {Hb(1) to Hb(Rmax)}.

In this regard, the following tables indicate permutated extension and shortened LDPC code families generated for different LDPC codes that are specified in IEEE std 802.11™REVmdD3.2. The following tables present permutation and shortening map information in the same manner as described above in respect of FIG. 9. Combining the tables below with the respective base PCM of LDPC codes defined in IEEE std 802.11™REVmdD3.2 provides the base PCM of the corresponding permutated extension and shortened (PES) LDPC retransmission codes.

Table 1A: Permuted extension and shortened LDPC code family generated based on [802.11REVmdD3.2] LDPC code with code block length 1944, Z=81 and code rate 1/2. Number of information columns of base PCM is k/Z=12; 972 additional parity bits are generated per extension. Table 1A shows the information column indices fi={fi (j)} of base PCM at each permuting and shortening operation. Combining fi={fi (j)} shown in Table 1A and the base parity check matrix of 802.11 LDPC code with code block length n=1944, k=1296, Z=81 and code rate 1/2 defined in [802.11REVmdD3.2] and shown in FIG. 7 yields the base PCM of PES LDPC codes.

TABLE 1A

Information column indices fi = {fi (j)} of base PCM of PES codes at the ith extension of 802.11 LDPC code (n = 1944, rate 1/2)

| i | Rate | \|f_i\| | 0 | 1 | 2 | 3 | 4 | 5 | 6 | 7 | 8 | 9 | 10 | 11 |
|---|------|--------|---|---|---|---|---|---|---|---|---|---|----|----|
| 0 | 0.500 |   |   |   |   |   |   |   |   |   |   |   |    |    |
| 1 | 0.333 | 7 |   |   |   |   | 8 |   | 9 | 6 | 4 | 3 | 2  | 11 |
| 2 | 0.250 | 6 |   | 8 |   |   | 4 | 0 | 9 | 5 |   | 10 |   |    |
| 3 | 0.200 | 5 |   | 9 |   |   | 8 | 7 |   |   | 4 | 6 |    |    |
| 4 | 0.167 | 4 |   | 9 |   |   | 0 |   |   |   |   |   | 4  | 3  |
| 5 | 0.143 | 4 |   | 3 |   |   | 9 | 1 |   |   |   | 8 |    |    |
| 6 | 0.125 | 3 |   |   |   |   | 9 |   |   | 11 |  | 3 |    |    |
| 7 | 0.111 | 3 |   |   |   | 3 |   |   |   | 6 | 5 |   |    |    |
| 8 | 0.100 | 3 |   |   |   |   | 6 |   | 3 |   |   |   | 9  |    |

Table 1B: Permuted extension and shortened LDPC code family generated based on 802.11 LDPC code with code block length 1944, Z=81 and code rate 2/3. 802.11 LDPC code with code block length n=1944, k=1296, Z=81 and code rate 2/3 is defined in [802.11REVmdD3.2]. The number of information columns of base PCM is k/Z=16. 648 additional parity bits are generated per extension.

TABLE 1B

Information column indices fi = {fi (j)} of base PCM of PES codes at the ith extension of the 802.11 LDPC code (n = 1944, rate 2/3)

| i | Rate | \|f_i\| | 0 | 1 | 2 | 3 | 4 | 5 | 6 | 7 | 8 | 9 | 10 | 11 | 12 | 13 | 14 | 15 |
|---|------|--------|---|---|---|---|---|---|---|---|---|---|----|----|----|----|----|----|
| 0 | 0.667 |   |   |   |   |   |   |   |   |   |   |   |    |    |    |    |    |    |
| 1 | 0.500 | 9 | 2 |   | 3 |   |   | 0 | 9 |   |   | 6 |    | 13 | 15 | 14 | 10 |    |
| 2 | 0.400 | 7 | 6 | 3 |   |   | 2 |   |   |   | 14 |  |    | 12 | 5  |    |    | 1  |
| 3 | 0.333 | 5 |   | 13 |  | 2 |   | 6 |   |   |   | 0 |    |    |    | 8  |    |    |
| 4 | 0.286 | 5 |   |   |   |   | 2 |   | 11 | 13 |  |   | 14 | 3  |    |    |    |    |
| 5 | 0.250 | 5 |   | 13 | 3 |   |   |   |   |   | 10 |  | 7  |    |    | 2  |    |    |
| 6 | 0.222 | 4 |   |   |   |   | 13 | 3 |   |   |   |   |    | 0  | 1  |    |    |    |
| 7 | 0.200 | 4 |   |   |   |   |   |   |   |   |   | 13 | 4  | 6  |    | 14 |    |    |
| 8 | 0.182 | 3 |   |   |   | 6 |   |   |   |   |   | 13 |    |    |    |    | 15 |    |

TABLE 1B-continued

Information column indices fi = {fi (j)} of base PCM of PES codes at the ith extension of the 802.11 LDPC code (n = 1944, rate 2/3)

| i | Rate | $|f_i|$ | 0 | 1 | 2 | 3 | 4 | 5 | 6 | 7 | 8 | 9 | 10 | 11 | 12 | 13 | 14 | 15 |
|---|------|------|---|---|---|---|---|---|---|---|---|---|----|----|----|----|----|----|
| 9  | 0.167 | 3 |   | 6 |   |   |   |   |    |    |   |   |    |    | 12 | 14 |    |    |
| 10 | 0.154 | 3 |   |   |   |   |   |   | 10 | 6  |   |   |    |    |    | 13 |    |    |

Table 1C: Permuted extension and shortened LDPC code family generated based on 802.11 LDPC code with code block length 1944, Z=81 and code rate 3/4. 802.11 LDPC code with code block length n=1944, k=1458, Z=81 and code rate 3/4 is defined in [802.11REVmdD3.2]. The number of information columns of base PCM is k/Z=18. 486 additional parity bits are generated per extension.

TABLE 1C

Information column indices f_i = {f_i (j)} of base PCM of PES codes at the ith extension of the 802.11 LDPC code (n = 1944, rate 3/4)

| i | Rate | $|f_i|$ | 0 | 1 | 2 | 3 | 4 | 5 | 6 | 7 | 8 | 9 | 10 | 11 | 12 | 13 | 14 | 15 | 16 | 17 |
|---|------|------|---|---|---|---|---|---|---|---|---|---|----|----|----|----|----|----|----|----|
| 0 | 0.750 |   |    |   |    |   |    |    |   |   |    |    |    |    |    |    |    |    |    |    |
| 1 | 0.600 | 10 | 10 |   | 5  |   | 2  |    |   | 6 | 0  | 1  |    | 15 | 7  |    | 11 | 17 |    | 10 |
| 2 | 0.500 | 7  |    |   | 10 | 2 |    |    | 4 |   |    | 14 | 5  |    | 8  |    |    | 1  |    |    |
| 3 | 0.429 | 6  |    |   |    | 10| 5  |    |   |   |    | 2  |    |    | 16 |    | 7  | 9  |    |    |
| 4 | 0.375 | 6  |    | 5 |    |   | 10 | 11 |   |   |    | 3  | 2  |    | 1  |    |    |    |    |    |
| 5 | 0.333 | 4  |    |   |    | 10| 2  | 17 | 12|   |    |    |    |    |    |    |    |    |    |    |
| 6 | 0.300 | 4  |    | 1 |    | 2 |    | 4  | 7 |   |    |    |    |    |    |    |    |    |    |    |
| 7 | 0.273 | 4  |    |   | 10 | 1 |    |    |   |   |    |    |    |    |    |    |    | 5  |    | 0  |
| 8 | 0.250 | 3  |    |   |    | 1 |    |    |   |   |    |    |    |    | 17 | 13 |    |    |    |    |
| 9 | 0.231 | 3  |    |   |    | 5 |    |    |   |   |    |    |    |    | 15 |    | 2  |    |    |    |
| 10| 0.214 | 3  |    |   |    |   | 1  |    | 8 |   | 5  |    |    |    |    |    |    |    |    |    |
| 11| 0.200 | 3  |    |   |    |   |    | 11 |   | 9 |    |    | 10 |    |    |    |    |    |    |    |

Table 1D: Permuted extension and shortened LDPC code family generated based on 802.11 LDPC code with code block length 1944, Z=81 and code rate 5/6. 802.11 LDPC code with code block length n=1944, k=1620, Z=81 and code rate 5/6 is defined in [802.11REVmdD3.2]. The number of information columns of base PCM is k/Z=20. 324 additional parity bits are generated per extension.

TABLE 1D

Information column indices f_i = {f_i (j)} of base PCM of PES codes at the ith extension of the 802.11 LDPC code (n = 1944, rate 5/6)

| i | Rate | $|f_i|$ | 0 | 1 | 2 | 3 | 4 | 5 | 6 | 7 | 8 | 9 | 10 | 11 | 12 | 13 | 14 | 15 | 16 | 17 | 18 | 19 |
|---|------|------|---|---|---|---|---|---|---|---|---|---|----|----|----|----|----|----|----|----|----|----|
| 0 | 0.833 |   |    |   |    |    |    |    |    |   |    |   |    |    |    |    |    |    |    |    |    |    |
| 1 | 0.714 | 11| 1  | 8 |    |    |    | 6  |    | 7 |    | 10|    | 5  | 0  | 19 | 4  |    |    |    | 9  | 18 |
| 2 | 0.625 | 7 | 7  |   | 8  | 17 | 10 |    |    |   |    | 1 |    |    |    |    |    | 15 | 13 |    |    |    |
| 3 | 0.556 | 6 |    | 7 |    |    |    |    |    |   | 19 |   |    | 6  |    |    |    | 8  | 12 | 2  |    |    |
| 4 | 0.500 | 5 |    |   |    |    | 10 |    | 7  |   | 8  |   |    |    |    |    |    | 16 |    |    |    | 9  |
| 5 | 0.455 | 5 |    | 3 | 7  |    |    |    |    |   | 10 |   |    |    |    |    |    | 1  |    |    | 19 |    |
| 6 | 0.417 | 4 |    | 7 |    | 10 |    |    |    |   |    |   |    | 4  |    |    |    |    | 11 |    |    |    |
| 7 | 0.385 | 4 |    |   |    |    |    |    | 8  | 7 |    |   | 17 |    |    |    |    |    |    | 2  |    |    |
| 8 | 0.357 | 4 |    | 8 |    |    |    |    |    |   |    |   |    |    |    |    | 10 | 19 |    | 5  |    |    |
| 9 | 0.333 | 4 | 7  | 19|    |    |    |    |    |   |    |   |    |    |    |    |    |    |    | 0  | 10 |    |
| 10| 0.313 | 4 |    |   |    | 8  |    |    |    |   |    | 10|    |    |    | 14 |    |    |    |    |    | 7  |
| 11| 0.294 | 4 |    |   |    |    |    | 8  |    | 10|    |   |    | 6  |    |    |    | 9  |    |    |    |    |
| 12| 0.278 | 3 |    |   |    |    |    | 8  |    |   | 15 |   |    |    |    |    |    |    | 10 |    |    |    |
| 13| 0.263 | 2 |    |   |    | 19 |    |    |    |   |    |   |    |    |    |    |    |    |    | 1  |    |    |
| 14| 0.250 | 2 |    |   | 19 |    |    |    |    |   |    |   |    |    |    |    |    |    |    | 4  |    |    |
| 15| 0.238 | 2 |    |   |    | 19 |    |    |    |   |    |   |    |    |    |    |    |    |    |    |    | 2  |

TABLE 1D-continued

Information column indices f_i = {f_i (j)} of base PCM of PES codes at the ith extension of the 802.11 LDPC code (n = 1944, rate 5/6)

| i | Rate | $|f_i|$ | 0 | 1 | 2 | 3 | 4 | 5 | 6 | 7 | 8 | 9 | 10 | 11 | 12 | 13 | 14 | 15 | 16 | 17 | 18 | 19 |
|---|------|-----|---|---|---|---|---|---|---|---|---|---|----|----|----|----|----|----|----|----|----|----|
| 16 | 0.227 | 2 | | | | | 19 | | | | | | | | | | | | | | 9 | |
| 17 | 0.217 | 2 | | | | | | | | 19 | | | | | | | | | | | 15 | |
| 18 | 0.208 | 2 | | | | 15 | | | | | | | | | | | | | | | 18 | |
| 19 | 0.200 | 2 | | | | | | | | | | | | | | 13 | 11 | | | | | |

Table 2A: Permuted extension and shortened LDPC code family generated based on 802.11 LDPC code with code block length 1296, Z=54 and code rate 1/2. 802.11 LDPC code with code block length n=1296, k=648, Z=54 and code rate 1/2 is defined in [802.11REVmdD3.2]. The number of information columns of base PCM is k/Z=12. 648 additional parity bits are generated per extension.

TABLE 2A

Information column indices $f_i = \{f_i(j)\}$ of base PCM of PES codes at the ith extension of the 802.11 LDPC code (n = 1296, rate 1/2)

| i | Rate | $|f_i|$ | 0 | 1 | 2 | 3 | 4 | 5 | 6 | 7 | 8 | 9 | 10 | 11 |
|---|------|-----|---|---|---|---|---|---|---|---|---|---|----|----|
| 0 | 0.500 | | | | | | | | | | | | | |
| 1 | 0.333 | 7 | | | | 7 | 8 | 2 | 11 | | | 4 | 3 | 5 |
| 2 | 0.250 | 6 | | | | 0 | 8 | | 6 | 9 | 4 | | 11 | |
| 3 | 0.200 | 5 | 8 | | 10 | 4 | | | | | | 3 | | 0 |
| 4 | 0.167 | 5 | | | | | 5 | 8 | | | 0 | 4 | 1 | |
| 5 | 0.143 | 5 | | | | | 7 | 8 | | 0 | | 11 | | 4 |
| 6 | 0.125 | 4 | | | | | 3 | 4 | 9 | | | 8 | | |
| 7 | 0.111 | 4 | | | | | | 5 | 11 | | 8 | | 4 | |
| 8 | 0.100 | 4 | | | | | 4 | | | 0 | | 8 | 2 | |

Table 2B: Permuted extension and shortened LDPC code family generated based on 802.11 LDPC code with code block length 1296, Z=54 and code rate 2/3. 802.11 LDPC code with code block length n=1296, k=864, Z=54 and code rate 2/3 is defined in [802.11REVmdD3.2] The number of information columns of base PCM is k/Z=16. 432 additional parity bits are generated per extension.

TABLE 2B

Information column indices $f_i = \{f_i(j)\}$ of base PCM of PES codes at the ith extension of the 802.11 LDPC code (n = 1296, rate 2/3)

| i | Rate | $|f_i|$ | 0 | 1 | 2 | 3 | 4 | 5 | 6 | 7 | 8 | 9 | 10 | 11 | 12 | 13 | 14 | 15 |
|---|------|-----|---|---|---|---|---|---|---|---|---|---|----|----|----|----|----|----|
| 0 | 0.667 | | | | | | | | | | | | | | | | | |
| 1 | 0.500 | 9 | | 0 | 2 | | | | 8 | 7 | | 11 | 1 | | 10 | | 9 | 6 |
| 2 | 0.400 | 7 | | 0 | 2 | | 10 | | | 12 | | | 4 | 7 | | 14 | | |
| 3 | 0.333 | 6 | | | 10 | 0 | | 2 | 13 | | 3 | | | | | | 8 | |
| 4 | 0.286 | 5 | | | | | 0 | 2 | | | | | 15 | | | 1 | | 4 |
| 5 | 0.250 | 5 | | 0 | 2 | | | | | | | 4 | | | | 8 | | 6 |
| 6 | 0.222 | 5 | 0 | | | | 4 | | | | | | | 7 | | 10 | | 5 |
| 7 | 0.200 | 4 | | 10 | | | | | | | 1 | 0 | | 12 | | | | |
| 8 | 0.182 | 3 | | | | 2 | | | | | | | | 4 | | | 3 | |
| 9 | 0.167 | 3 | | | | | | 0 | | 1 | | | | | | | 11 | |
| 10 | 0.154 | 3 | | | | | | 2 | 1 | | | | 7 | | | | | |
| 11 | 0.142 | 3 | | | | 2 | | | | 8 | | | | 10 | | | | |
| 12 | 0.133 | 3 | | | | 2 | 4 | | | | | 9 | | | | | | |
| 13 | 0.125 | 3 | | | | 0 | | | | | | | 4 | | | | 14 | |
| 14 | 0.118 | 3 | | 1 | 2 | | | | | | | | | | | 13 | | |
| 15 | 0.111 | 3 | | | | 10 | | | 15 | | | | | | | | 5 | |
| 16 | 0.105 | 3 | | | 10 | | | | | | | | 4 | 1 | 0 | | | |
| 17 | 0.100 | 3 | | | 2 | | | | | | | | 10 | 6 | | | | |

Table 2C: Permuted extension and shortened LDPC code family generated based on 802.11 LDPC code with code block length 1296, Z=54 and code rate 3/4. 802.11 LDPC code with code block length n=1296, k=972, Z=54 and code rate 3/4 is defined in [802.11REVmdD3.2] The number of information columns of base PCM is k/Z=18. 324 additional parity bits are generated per extension.

TABLE 11c

Information column indices $f_i = \{f_i(j)\}$ of base PCM of PES codes at the ith extension of the 802.11 LDPC code (n = 1296, rate 3/4)

| i | Rate | $|f_i|$ | 0 | 1 | 2 | 3 | 4 | 5 | 6 | 7 | 8 | 9 | 10 | 11 | 12 | 13 | 14 | 15 | 16 | 17 |
|---|------|-----|---|---|---|---|---|---|---|---|---|---|----|----|----|----|----|----|----|----|
| 0 | 0.750 |   |   |   |   |   |   |   |   |   |   |   |    |    |    |    |    |    |    |    |
| 1 | 0.600 | 10 |  |   |   | 3 | 5 | 0 |   | 13 | 6 | 7 | 12 | 4 |    | 1  | 8  |    |    |    |
| 2 | 0.500 | 7 |   |   | 3 | 5 |   |   |   |   |   |   |    | 14 | 17 | 9  |    | 1  | 0  |    |
| 3 | 0.429 | 6 |   |   | 3 |   |   | 1 |   | 16 |   |   |    | 2  |    | 5  |    |    | 8  |    |
| 4 | 0.375 | 5 |   | 3 |   |   | 5 |   |   |   | 6 |   |    |    |    | 11 |    |    | 0  |    |
| 5 | 0.333 | 5 |   |   | 5 |   |   | 1 | 3 |   |   |   |    |    | 15 |    | 7  |    |    |    |
| 6 | 0.300 | 5 |   | 5 |   |   | 3 |   |   |   |   | 14 |   |    |    |    |    | 0  | 8  |    |
| 7 | 0.273 | 5 |   |   | 3 |   |   |   | 5 |   |   |   | 0  | 4  | 1  |    |    | 10 |    |    |
| 8 | 0.250 | 4 |   | 5 |   |   |   | 3 |   |   | 13 |   |   |    |    |    |    | 10 |    | 5  |
| 9 | 0.231 | 4 |   | 3 |   |   | 0 |   |   |   | 12 |   |   |    |    |    |    |    |    | 5  |
| 10 | 0.214 | 4 |  |   | 5 |   |   |   |   |   |   |   |    |    | 13 | 3  | 17 |    |    |    |
| 11 | 0.200 | 4 |  | 3 |   |   |   |   | 0 |   |   | 2 |    |    |    |    |    |    |    | 1  |
| 12 | 0.188 | 3 |  |   |   |   | 5 |   |   |   |   |   |    |    |    |    |    |    | 6  | 1  |
| 13 | 0.176 | 3 |  | 3 |   |   |   |   |   |   |   |   |    | 13 |    | 8  |    |    |    |    |
| 14 | 0.167 | 3 | 3 |  |   |   |   |   |   |   |   |   |    |    |    |    |    |    | 0  | 13 |
| 15 | 0.158 | 3 |  | 5 |   |   |   |   | 1 | 15 |   |   |    |    |    |    |    |    |    |    |
| 16 | 0.150 | 3 |  |   |   | 1 |   |   | 3 |   |   | 9 |    |    |    |    |    |    |    |    |
| 17 | 0.142 | 3 |  |   |   |   | 3 | 5 |   |   |   |   |    |    |    |    | 16 |    |    |    |
| 18 | 0.136 | 3 |  |   | 3 |   |   |   |   |   | 11 |  |   |    |    |    |    |    | 10 |    |
| 19 | 0.130 | 3 |  |   |   |   |   |   | 0 |   |   |   |    |    |    | 1  |    | 5  |    |    |

Table 2D: Permuted extension and shortened LDPC code family generated based on 802.11 LDPC code with code block length 1296, Z=54 and code rate 5/6. 802.11 LDPC code with code block length n=1296, k=1080, Z=54 and code rate 5/6 is defined in [802.11REVmdD3.2] The number of information columns of base PCM is k/Z=20. 216 additional parity bits are generated per extension.

TABLE 2D

Information column indices $f_i = \{f_i(j)\}$ of base PCM of PES codes at the ith extension of the 802.11 LDPC code (n = 1296, rate 5/6)

| i | Rate | $|f_i|$ | 0 | 1 | 2 | 3 | 4 | 5 | 6 | 7 | 8 | 9 | 10 | 11 | 12 | 13 | 14 | 15 | 16 | 17 | 18 | 19 |
|---|------|-----|---|---|---|---|---|---|---|---|---|---|----|----|----|----|----|----|----|----|----|----|
| 0 | 0.833 |   |   |   |   |   |   |   |   |   |   |   |    |    |    |    |    |    |    |    |    |    |
| 1 | 0.714 | 11 | 5 | 2 |   |   |   | 10 |   | 3 |   | 9 | 6 |    |    |    | 14 | 1 | 13 | 12 | 8 |    |
| 2 | 0.625 | 7 |   | 5 |   |   |   | 10 | 2 |   | 3 |   |   | 0  |    |    |    |    | 15 | 18 |    |    |
| 3 | 0.556 | 6 | 14 |  |   | 3 |   | 10 |   |   |   |   |   |    |    |    | 11 | 6 |   |    |    | 4 |
| 4 | 0.500 | 5 |   |   |   |   | 5 |   |   | 3 |   |   | 19 |    | 10 |    |    |    | 9  |    |    |    |
| 5 | 0.455 | 4 |   | 3 |   |   |   | 2 |   |   |   |   |    |    |    |    |    |    | 7  |    |    | 14 |
| 6 | 0.417 | 4 |   |   |   |   | 10 |  |   | 3 |   |   |    |    |    |    |    |    |    |    | 0 | 1 |
| 7 | 0.385 | 4 |   |   |   |   |   |   |   |   |   |   |    |    |    | 6  | 10 |    | 16 | 3  |    |    |
| 8 | 0.357 | 4 |   |   |   |   |   | 3 |   | 10 |  |   |    | 5  |    |    |    |    | 12 |    |    |    |
| 9 | 0.333 | 4 |   |   | 10 |  |   |   |   |   | 3 |   |    |    |    |    | 14 | 17 |    |    |    |    |
| 10 | 0.313 | 3 |  |   |   |   |   | 10 |  |   |   |   |    |    |    | 5  |    |    | 8  |    |    |    |
| 11 | 0.294 | 3 |  |   |   |   |   |   |   |   | 10 |  |    |    |    |    |    |    | 2  |    |    | 11 |
| 12 | 0.278 | 3 |  |   | 3 |   |   |   |   | 10 |  |   |    |    |    |    |    | 15 |    |    |    |    |
| 13 | 0.263 | 3 | 0 |  |   |   | 3 |   |   |   |   |   |    |    |    |    |    |    | 6  |    |    |    |
| 14 | 0.250 | 3 |  |   |   |   |   |   |   |   |   | 3 |    |    |    |    |    | 19 |    |    |    | 14 |
| 15 | 0.238 | 3 |  |   |   |   |   |   |   |   |   |   |    |    |    |    |    | 2  |    | 10 | 5  |    |
| 16 | 0.227 | 3 |  |   |   |   |   | 10 |  |   |   |   |    |    |    |    |    | 14 |    | 0  |    |    |
| 17 | 0.217 | 2 |  |   |   |   |   |   |   |   |   |   |    |    | 3  |    |    | 5  |    |    |    |    |
| 18 | 0.208 | 2 |  |   |   |   |   |   |   |   |   |   |    |    |    |    | 10 |    |    | 13 |    |    |
| 19 | 0.200 | 2 |  |   |   |   | 14 |  |   |   |   |   |    |    |    |    |    |    |    | 4  |    |    |

Table 3A: Permuted extension and shortened LDPC code family generated based on 802.11 LDPC code with code block length 648, Z=27 and code rate 1/2. 802.11 LDPC code with code block length n=648, k=324, Z=27 and code rate 1/2 is defined in [802.11REVmdD3.2] The number of information columns of base PCM is k/Z=12. 324 additional parity bits are generated per extension.

TABLE 3A

Information column indices $f_i = \{f_i(j)\}$ of base PCM of PES codes at the ith extension of the 802.11 LDPC code (n = 648, rate 1/2)

| i | Rate | $|f_i|$ | 0 | 1 | 2 | 3 | 4 | 5 | 6 | 7 | 8 | 9 | 10 | 11 |
|---|------|---------|---|---|---|---|---|---|---|---|---|---|----|----|
| 0 | 0.500 |   |   |   |   |   |   |   |   |   |   |   |    |    |
| 1 | 0.333 | 7 | 0 | 1 |   |   | 9 | 4 | 3 | 11|   |   | 7  |    |
| 2 | 0.250 | 6 | 0 | 10|   |   | 4 |   | 3 |   |   | 5 |    | 8  |
| 3 | 0.200 | 5 | 4 | 11|   |   | 0 |   | 2 |   |   | 3 |    |    |
| 4 | 0.167 | 5 |   | 8 |   | 3 | 4 |   |   |   | 0 |   | 6  |    |
| 5 | 0.143 | 5 |   |   |   | 4 | 9 | 0 |   |   | 7 |   | 3  |    |
| 6 | 0.125 | 4 |   | 11|   |   |   |   |   |   |   |   |    |    |
| 7 | 0.111 | 3 |   |   |   |   | 4 |   |   | 8 |   |   |    | 7  |
| 8 | 0.100 | 3 |   | 1 |   |   | 0 |   |   |   |   |   |    | 3  |

Note: i=6 row shows values 0.125, 4 | ... 11 ... 10 ... 4 ... 0.

Table 3B: Permuted extension and shortened LDPC code family generated based on 802.11 LDPC code with code block length 648, Z=27 and code rate 2/3. 802.11 LDPC code with code block length n=648, k=432, Z=27 and code rate 2/3 is defined in [802.11REVmdD3.2] The number of information columns of base PCM is k/Z=16. 216 additional parity bits are generated per extension.

TABLE 3B

12b Information column indices $f_i = \{f_i(j)\}$ of base PCM of PES codes at the ith extension of the 802.11 LDPC code (n = 648, rate 2/3)

| i | Rate | $|f_i|$ | 0 | 1 | 2 | 3 | 4 | 5 | 6 | 7 | 8 | 9 | 10 | 11 | 12 | 13 | 14 | 15 |
|---|------|---------|---|---|---|---|---|---|---|---|---|---|----|----|----|----|----|----|
| 0 | 0.667 |   |   |   |   |   |   |   |   |   |   |   |    |    |    |    |    |    |
| 1 | 0.500 | 9 | 0 | 1 |   |   |   |   |   | 8 | 5 |   | 7  | 10 |    |    | 2  | 4  | 14 |
| 2 | 0.400 | 6 |   |   | 1 |   |   |   |   | 0 | 2 |   |    | 13 | 3  | 12 |    |    |
| 3 | 0.333 | 6 | 0 |   | 1 |   |   |   |   |   |   |   |    | 15 | 6  | 4  |    | 2  |
| 4 | 0.286 | 5 |   | 1 |   | 0 |   |   | 2 |   |   |   | 9  |    | 14 |    |    |    |
| 5 | 0.250 | 5 | 0 |   | 1 |   |   |   |   |   |   | 7 |    |    |    |    | 2  | 5  |
| 6 | 0.222 | 4 |   | 0 |   | 2 |   |   |   |   |   |   |    |    |    | 3  | 4  |    |
| 7 | 0.200 | 4 |   | 1 | 2 |   |   |   |   |   |   |   |    | 11 |    | 13 |    |    |
| 8 | 0.182 | 4 |   | 0 | 2 |   |   |   |   |   | 1 |   |    | 8  |    |    |    |    |
| 9 | 0.167 | 4 | 0 |   |   | 1 |   |   |   |   |   |   |    |    |    |    | 14 | 6  |
| 10| 0.154 | 4 | 0 |   |   |   |   |   | 2 |   |   |   |    | 13 | 7  |    |    |    |
| 11| 0.142 | 3 |   |   |   | 1 |   |   | 0 |   |   |   |    |    |    | 4  |    |    |
| 12| 0.133 | 3 | 0 |   |   |   |   |   |   |   |   | 7 | 14 |    |    |    |    |    |
| 13| 0.125 | 3 |   | 1 |   |   |   |   |   |   |   |   |    | 12 |    |    | 10 |    |
| 14| 0.118 | 3 |   |   | 2 |   |   |   |   |   |   | 0 | 15 |    |    |    |    |    |
| 15| 0.111 | 3 | 0 |   |   |   |   |   |   |   |   | 9 |    |    |    | 11 |    |    |

Table 3C: Permuted extension and shortened LDPC code family generated based on 802.11 LDPC code with code block length 648, Z=27 and code rate 3/4. 802.11 LDPC code with code block length n=648, k=486, Z=27 and code rate 3/4 is defined in [802.11REVmdD3.2] The number of information columns of base PCM is k/Z=18. 162 additional parity bits are generated per extension.

TABLE 3C

Information column indices $f_i = \{f_i(j)\}$ of base PCM of PES codes at the ith extension of the 802.11 LDPC code (n = 648, rate 3/4)

| i | Rate | $|f_i|$ | 0 | 1 | 2 | 3 | 4 | 5 | 6 | 7 | 8 | 9 | 10 | 11 | 12 | 13 | 14 | 15 | 16 | 17 |
|---|------|---------|---|---|---|---|---|---|---|---|---|---|----|----|----|----|----|----|----|----|
| 0 | 0.750 |   |   |   |   |   |   |   |   |   |   |   |    |    |    |    |    |    |    |    |
| 1 | 0.600 | 10 |   |   | 3 |   |   | 16| 1 |   | 0 |   |    | 10 |    | 7  | 4  | 5  | 13 | 2  |
| 2 | 0.500 | 7 |   | 16|   | 3 |   | 12|   |   |   | 0 |    |    | 2  |    | 14 |    |    | 17 |
| 3 | 0.429 | 7 | 3 |   | 12|   |   | 0 |   |   |   | 1 |    |    |    | 6  |    |    | 11 | 16 |
| 4 | 0.375 | 6 |   | 16|   | 12|   |   |   |   |   | 3 |    |    | 7  |    |    |    | 9  | 0  |
| 5 | 0.333 | 6 | 12|   | 0 |   | 3 |   |   |   |   |   | 4  |    |    | 1  |    | 15 |    |    |
| 6 | 0.300 | 4 |   |   |   |   | 3 |   |   |   |   |   |    | 10 | 12 |    |    |    |    | 1  |
| 7 | 0.273 | 4 |   |   |   | 3 |   |   |   |   |   |   |    | 16 |    |    | 0  |    |    | 2  |
| 8 | 0.250 | 4 |   | 12|   |   |   |   |   | 0 |   | 8 |    |    |    |    | 6  |    |    |    |
| 9 | 0.231 | 4 |   |   |   |   | 3 |   |   | 1 |   |   |    |    | 13 |    | 12 |    |    |    |
| 10| 0.214 | 4 | 0 |   |   |   |   |   |   | 3 |   | 17|    |    |    | 7  |    |    |    |    |
| 11| 0.200 | 3 | 3 |   |   |   |   |   |   |   |   |   |    | 6  | 16 |    |    |    |    |    |
| 12| 0.188 | 3 |   | 12| 3 |   |   |   |   |   |   |   |    |    |    |    | 4  |    |    |    |

TABLE 3C-continued

Information column indices $f_i = \{f_i(j)\}$ of base PCM of PES codes at the ith extension of the 802.11 LDPC code (n = 648, rate 3/4)

| i | Rate | $\|f_i\|$ | 0 | 1 | 2 | 3 | 4 | 5 | 6 | 7 | 8 | 9 | 10 | 11 | 12 | 13 | 14 | 15 | 16 | 17 |
|---|---|---|---|---|---|---|---|---|---|---|---|---|---|---|---|---|---|---|---|---|
| 13 | 0.176 | 3 | 3 | | | | | | | | | | | 7 | | | 1 | | | |
| 14 | 0.167 | 3 | 12 | 0 | | | | | | | | | | | | 5 | | | | |
| 15 | 0.158 | 3 | | | | 16 | | 3 | | | | | | | | 14 | | | | |
| 16 | 0.150 | 3 | | | | | | | | | 0 | | 8 | 1 | | | | | | |
| 17 | 0.142 | 3 | 16 | | | | | | | | | | 9 | | | 15 | | | | |
| 18 | 0.136 | 3 | | | | | | | | 12 | | | | 1 | 16 | | | | | |
| 19 | 0.130 | 3 | | | | | 12 | | | | | | | | | 11 | | 5 | | |

Table 3D: Permuted extension and shortened LDPC code family generated based on 802.11 LDPC code with code block length 648, Z=27 and code rate 5/6. 802.11 LDPC code with code block length n=648, k=540, Z=27 and code rate 5/6 is defined in [802.11REVmdD3.2]. The number of information columns of base PCM is k/Z=20. 108 additional parity bits are generated per extension.

TABLE 3D

Information column indices $f_i = \{f_i(j)\}$ of base PCM of PES codes at the ith extension of the 802.11 LDPC code (n = 648, rate 5/6)

| i | Rate | $\|f_i\|$ | 0 | 1 | 2 | 3 | 4 | 5 | 6 | 7 | 8 | 9 | 10 | 11 | 12 | 13 | 14 | 15 | 16 | 17 | 18 | 19 |
|---|---|---|---|---|---|---|---|---|---|---|---|---|---|---|---|---|---|---|---|---|---|---|
| 0 | 0.833 | | | | | | | | | | | | | | | | | | | | | |
| 1 | 0.714 | 11 | | 7 | | | | 8 | | 10 | | 18 | | 17 | 3 | 19 | 1 | 4 | 11 | 9 | | |
| 2 | 0.625 | 7 | | | | | 7 | 0 | 18 | 9 | | | | | 15 | | 8 | | | 6 | | |
| 3 | 0.556 | 6 | | | 11 | | | | | | 18 | 8 | 5 | 2 | | | | | | | | 1 |
| 4 | 0.500 | 5 | | 8 | | | | | 9 | | | | | 17 | 13 | | | 18 | | | | |
| 5 | 0.455 | 4 | | | 8 | | | | | | | 11 | | 14 | | | | | 7 | | | |
| 6 | 0.417 | 4 | | | | 18 | | | | | | | | 0 | | | 10 | | 8 | | | |
| 7 | 0.385 | 4 | | | | | | | 18 | | | 1 | | 3 | | 8 | | | 12 | | | |
| 8 | 0.357 | 4 | | | | | | | 8 | | | 9 | | 18 | | | | 11 | | 12 | | |
| 9 | 0.333 | 3 | 18 | | | | 8 | | | | | | | | | | | 11 | | | | |
| 10 | 0.313 | 3 | 8 | | | | | 6 | | | | | 4 | | | | | | | | | |
| 11 | 0.294 | 3 | | | | 18 | | | | | | | | 17 | | | | | | 5 | | |
| 12 | 0.278 | 3 | | | | | | | | | | | | 0 | | | | 18 | 6 | | | |
| 13 | 0.263 | 3 | | 18 | | 5 | | | | | | | | | 16 | | | | | | | |
| 14 | 0.250 | 2 | | 18 | | | | | | | | | | | 7 | | | | | | | |
| 15 | 0.238 | 2 | | | | | | | | | | | | | 9 | 1 | | | | | | |
| 16 | 0.227 | 2 | | | | | | 5 | | | | | | | 6 | | | | | | | |
| 17 | 0.217 | 2 | 18 | | | | | | | | | | | 1 | | | | | | | | |
| 18 | 0.208 | 2 | | | | | | | | | | | | | 5 | 8 | | | | | | |
| 19 | 0.200 | 2 | | | | | 18 | | | | | | | | 19 | | | | | | | |

Figure 13:
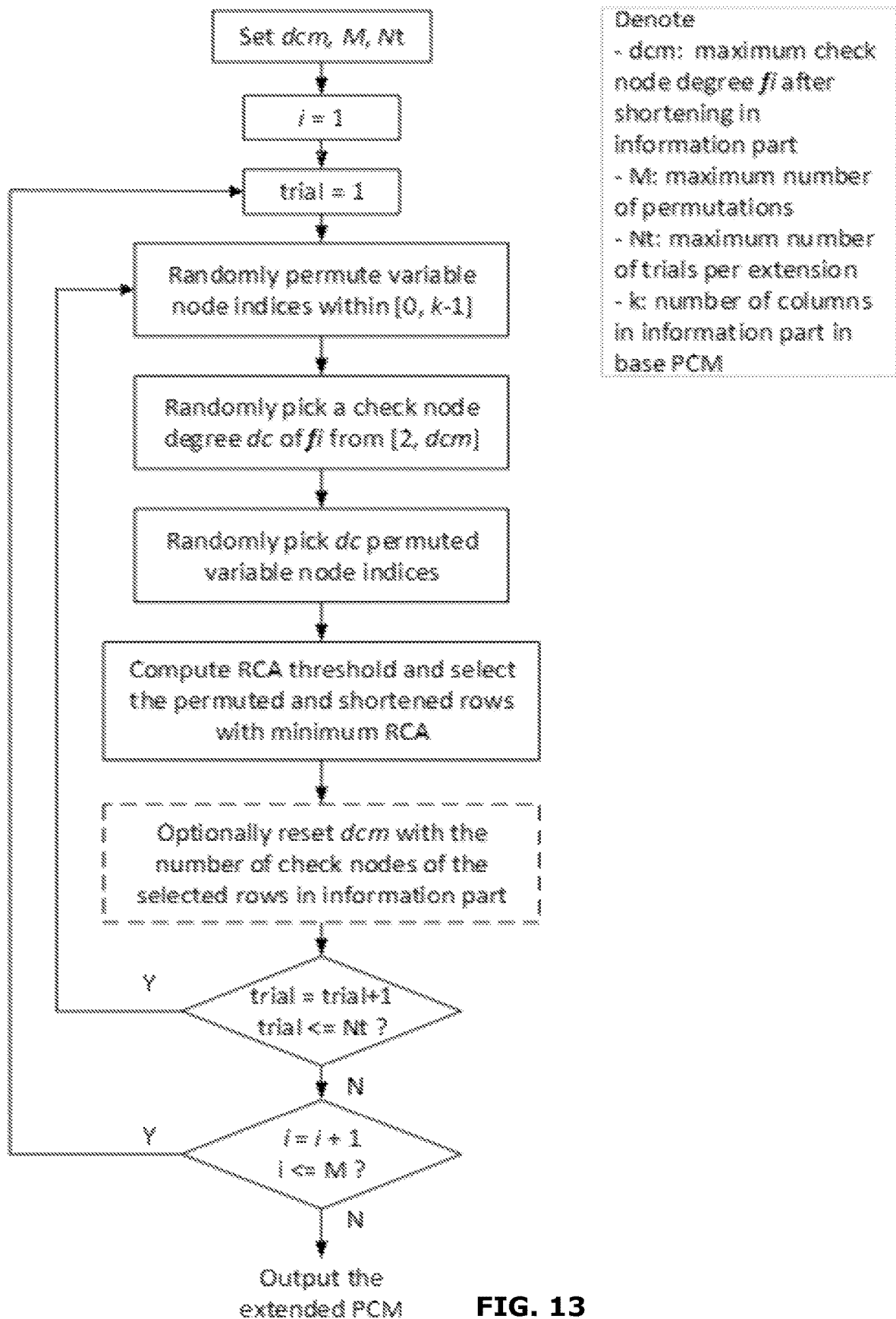
FIG. 13 is a flowchart of a procedure for determining optimized LDPC retransmission PCM.

In example embodiments the above tables can be constructed based on the following procedure, with reference to FIG. 13, which shows a procedure for optimization of the ith permutation and shortening operation on the information columns of the base PCM of the mother LDPC code. The above tables assume that $f_i = \{f_i(j)\}$ (i≥0, 0≤j≤k/Z−1) is a subset of information column indices of the original base mother LPDC code after the ith permuted extension and shortening operations (when i=0, $f_0$ is the full set of column indices of the mother code). ILI is the number of information columns at the ith extension.

Design of a rate-compatible code family with backward compatibility of the mother code is focused on identifying $\Pi\Lambda_i(H_{bI})$ for each permuted extension and shortening operation i. The newly added (n−k) rows after the ith permuted extension and shortening operations include the optimization of $\Pi\Lambda_i(H_{bI})$ which is obtained by minimizing iterative decoding thresholds for each rate with a greedy procedure and $H_{bP}$, the parity part of the base PCM of the mother LDPC code.

The ith combination of permutation and shortening yields a code with the PCM with (i+1)×(n−k) rows and n+i×(n−k) columns, increases information part of variable node degree at the columns in $f_i$, keeps the parity part of variable node degree as 2 and results in the extended check nodes of degree $|f_i|+2$. FIG. 13 illustrates the procedure for optimization of $\Pi s_i(H_{bI})$ in order to obtain the information column indices $f_i = \{f_i(j)\}$ after the ith permutation and shortening operation on the information columns of the base PCM of the mother code. The information column indices $f_i = \{f_i(j)\}$ after the ith permutation and shortening operation on the information columns of the base PCM of the mother code, i.e., the 802.11 LDPC code, can be obtained.

As will be appreciated from the above description, in example embodiments, for the permutated extension and shortened LDPC code words, given information block length k, code block length n, and code rate r: during the initial transmission (i.e., i=0), the LDPC codeword $c_k$ (1≤j≤Ncw) is encoded by using the PCM of the corresponding mother code, i.e., IEEE 802.11 LDPC code, which is defined in [Annex F, 802.11REVmdD3.2]; during a retransmission in HARQ (i.e., i>0), the extended n−k parity check bits in LDPC codeword $c_q$ (1≤q≤Ncw) are generated based on the base PCM of fi defined in Embodiments 3-5 disclosed in this application and permutation and shortening for the given corresponding code parameters list above. Codeword Cq(i) for the ith retransmission is generated by combining the information bits in information block IBq and/or the generated extended parity bits.

The present disclosure provides certain example algorithms and calculations for implementing examples of the disclosed methods and systems. However, the present disclosure is not bound by any particular algorithm or calculation. Although the present disclosure describes methods and processes with steps in a certain order, one or more steps of the methods and processes may be omitted or altered as appropriate. One or more steps may take place in an order other than that in which they are described, as appropriate.

Through the descriptions of the preceding embodiments, the present invention may be implemented by using hardware only, or by using software and a necessary universal hardware platform, or by a combination of hardware and software. Based on such understandings, the technical solution of the present invention may be embodied in the form of a software product. The software product may be stored in a non-volatile or non-transitory storage medium, which can be a compact disk read-only memory (CD-ROM), USB flash drive, or a hard disk. The software product includes a number of instructions that enable a computer device (personal computer, server, or network device) to execute the methods provided in the embodiments of the present invention.

Although the present invention and its advantages have been described in detail, it should be understood that various changes, substitutions and alterations can be made herein without departing from the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

The invention claimed is:

1. A method performed at a wireless transmitting station, comprising:
generating, using a LDPC encoder at the wireless transmitting station, a first low density parity check (LPDC) codeword including information bits and parity check bits, by encoding a first source word for a first transmission;
responsive to receiving an indication of a failed codeword in the first transmission, generating, using the LDPC encoder at the wireless transmitting station, a second LDPC codeword by encoding a second source word for a retransmission for the first LDPC codeword, the second LDPC codeword including a permutated subset of the information bits included in the first LDPC codeword and parity check bits corresponding to the permutated subset of information bits;
generating, at the wireless transmitting station, a retransmission codeword for the first LDPC codeword, based on the second LDPC codeword; and
transmitting the retransmission codeword to a destination station.

2. The method of claim 1 wherein the first LDPC codeword conforms to a first parity check matrix and the second LDPC codeword conforms to a second parity check matrix that is derived by permuting locations of columns in the first parity check matrix that correspond to information bits and copying a portion of the first parity matrix that corresponds to parity check bits.

3. The method of claim 1 wherein the first LDPC codeword and the second LDPC codeword are each generated using an identical generator matrix.

4. The method of claim 1 wherein the first LDPC codeword and the second LDPC codeword have the same length, and generating the second LDPC codeword by an LDPC encoder comprises including a plurality of bits from the first source word in a second source word in an order that is different than the order that the plurality of bits are included in the first source word, wherein a further plurality of bits from the first source word are not included in the second source word, wherein the second source word is the same length as the first source word and bit locations in the second source word that are not populated with bits from the first source word are set to zero.

5. The method of claim 4 wherein the order of the bits is specified by a predefined permutation and shortening map that maps locations of a plurality of bits in the first source word to locations of the same bits in the second source word.

6. The method of claim 5 wherein the permutation and shortening map maps the order of sets of successive bits from locations in the first source word to successive bit locations in the second source word.

7. The method of claim 6 wherein the method can include comprises generating multiple LDPC codewords for multiple successive retransmissions for the first LDPC codeword, the multiple LDPC codewords each including a unique permutated subset of information bits included in the first LDPC codeword and parity check bits corresponding to the permutated subset of information bits.

8. The method of claim 1 wherein the retransmission codeword comprises information bits and parity check bits from the second LDPC codeword.

9. The method of claim 1 wherein the retransmission codeword comprises information bits from the first LDPC codeword and parity check bits from the second LDPC codeword, the retransmission codeword being the same length as the first codeword.

10. The method of claim 1, wherein the retransmission codeword comprises parity check bits from the second LDPC codeword and does not include information code bits from the second LDPC codeword.

11. The method of claim 1 comprising transmitting the first LDPC codeword in a wireless local area network for the destination station and receiving a message from the destination station indicating that the first LDPC codeword has not been properly decoded.

12. The method of claim 5 wherein a set of permutation and shortening maps for successive retransmissions i=1 to 8 is shown in the following table, wherein each permutation and shortening map corresponds to a base LDPC parity code matrix as defined by 802.11REVmdD3.2 for an LDPC code with code block length 1944, Z=81 and code rate 1/2, wherein each row i=1 to 8 defines a respective permutation and shortening map, and for each row i, a blank location under a column index j indicates a set of Z bits in the second source word at a location corresponding to the index j are to be set to zero and a value under a column location j indicates that a set of Z bits in the first source word at a location corresponding to that value are to be copied to a Z-bit location in the second source word at a location corresponding to the index j:

| i | Rate | $|f_i|$ | 0 | 1 | 2 | 3 | 4 | 5 | 6 | 7 | 8 | 9 | 10 | 11 |
|---|------|-----|---|---|---|---|---|---|---|---|---|---|----|----|
| 0 | 0.500 |   |   |   |   |   |   |   |   |   |   |   |    |    |
| 1 | 0.333 | 7 |   |   |   |   | 8 |   | 9 | 6 | 4 | 3 | 2  | 11 |
| 2 | 0.250 | 6 | 8 |   |   |   | 4 | 0 | 9 | 5 |   | 10 |   |    |
| 3 | 0.200 | 5 | 9 |   |   |   |   |   | 8 | 7 |   | 4 | 6  |    |
| 4 | 0.167 | 4 | 9 |   |   | 0 |   |   |   |   |   |   | 4  | 3  |
| 5 | 0.143 | 4 | 3 |   |   | 9 | 1 |   |   |   | 8 |   |    |    |
| 6 | 0.125 | 3 |   |   |   | 9 |   |   | 11 |   | 3 |   |    |    |
| 7 | 0.111 | 3 |   | 3 |   |   |   |   | 6 | 5 |   |   |    |    |
| 8 | 0.100 | 3 |   |   |   | 6 |   | 3 |   |   |   | 9 |    |    |

13. The method of claim 5 wherein a set of permutation and shortening maps for successive retransmissions i=1 to 10 is shown in the following table, wherein each permutation and shortening map corresponds to a base LDPC parity code matrix as defined by 802.11REVmdD3.2 for an code block length 1944, Z=81 and code rate 2/3, wherein each row i=1 to 10 defines a respective permutation and shortening map, and for each row i, a blank location under a column index j indicates a set of Z bits in the second source word at a location corresponding to the index j are to be set to zero and a value under a column location j indicates that a set of Z bits in the first source word at a location corresponding to that value are to be copied to a Z-bit location in the second source word at a location corresponding to the index j:

| i | Rate | $|f_i|$ | 0 | 1 | 2 | 3 | 4 | 5 | 6 | 7 | 8 | 9 | 10 | 11 | 12 | 13 | 14 | 15 |
|---|------|-----|---|---|---|---|---|---|---|---|---|---|----|----|----|----|----|----|
| 0 | 0.667 |   |   |   |   |   |   |   |   |   |   |   |    |    |    |    |    |    |
| 1 | 0.500 | 9 | 2 |   | 3 |   | 0 | 9 |   | 6 |   |   |    |    | 13 | 15 | 14 | 10 |
| 2 | 0.400 | 7 | 6 | 3 |   |   | 2 |   |   |   |   | 14 |   | 12 | 5 |    |    | 1  |
| 3 | 0.333 | 5 | 13 |   | 2 |   |   | 6 |   |   |   |   | 0  |    |    | 8  |    |    |
| 4 | 0.286 | 5 |   |   |   |   | 2 |   | 11 | 13 |   |   | 14 | 3 |    |    |    |    |
| 5 | 0.250 | 5 |   | 13 | 3 |   |   |   |   |   | 10 |   | 7 |    |    | 2  |    |    |
| 6 | 0.222 | 4 |   |   |   |   | 13 | 3 |   |   |   |   |    | 0  | 1  |    |    |    |
| 7 | 0.200 | 4 |   |   |   |   |   |   |   |   | 13 | 4 | 6  |    | 14 |    |    |    |
| 8 | 0.182 | 3 |   |   |   | 6 |   |   |   |   | 13 |   |    |    |    |    | 15 |    |
| 9 | 0.167 | 3 |   | 6 |   |   |   |   |   |   |   |   |    |    |    |    | 12 | 14 |
| 10 | 0.154 | 3 |   |   |   |   |   |   |   | 10 | 6 |   |    |    |    | 13 |    |    |

14. The method of claim 5 wherein a set of permutation and shortening maps for successive retransmissions i=1 to 11 is shown in the following table, wherein each permutation and shortening map corresponds to a base LDPC parity code matrix as defined by 802.11REVmdD3.2 for an LDPC code with code block length 1944, Z=81 and code rate 3/4, wherein each row i=1 to 11 defines a respective permutation and shortening map, and for each row i, a blank location under a column index j indicates a set of Z bits in the second source word at a location corresponding to the index j are to be set to zero and a value under a column location j indicates that a set of Z bits in the first source word at a location corresponding to that value are to be copied to a Z-bit location in the second source word at a location corresponding to the index j:

| i | Rate | $|f_i|$ | 0 | 1 | 2 | 3 | 4 | 5 | 6 | 7 | 8 | 9 | 10 | 11 | 12 | 13 | 14 | 15 | 16 | 17 |
|---|------|-----|---|---|---|---|---|---|---|---|---|---|----|----|----|----|----|----|----|----|
| 0 | 0.750 |   |   |   |   |   |   |   |   |   |   |   |    |    |    |    |    |    |    |    |
| 1 | 0.600 | 10 | 10 |   |   | 5 |   | 2 |   |   | 6 | 0 | 1  |    | 15 | 7  |    | 11 | 17 | 10 |
| 2 | 0.500 | 7 |   |   | 10 | 2 |   |   | 4 |   |   | 14 | 5 |    | 8  |    |    | 1  |    |    |
| 3 | 0.429 | 6 |   |   |   |   | 10 | 5 |   |   |   | 2 |    |    |    | 16 |    | 7  | 9  |    |
| 4 | 0.375 | 6 |   | 5 |   |   |   | 10 | 11 |   |   |   | 3  | 2  | 1  |    |    |    |    |    |
| 5 | 0.333 | 4 |   |   |   |   |   | 10 | 2 | 17 | 12 |   |    |    |    |    |    |    |    |    |
| 6 | 0.300 | 4 |   | 1 |   | 2 |   |   | 4 |   | 7 |   |    |    |    |    |    |    |    |    |
| 7 | 0.273 | 4 |   |   |   | 10 | 1 |   |   |   |   |   |    |    |    |    |    | 5  |    | 0  |
| 8 | 0.250 | 3 |   |   |   |   | 1 |   |   |   |   |   |    |    |    | 17 | 13 |    |    |    |
| 9 | 0.231 | 3 |   |   |   |   | 5 |   |   |   |   |   |    |    |    | 15 |    | 2  |    |    |
| 10 | 0.214 | 3 |   |   |   |   |   | 1 |   | 8 |   | 5 |    |    |    |    |    |    |    |    |
| 11 | 0.200 | 3 |   |   |   |   |   |   |   |   |   | 11 |    | 9  |    | 10 |    |    |    |    |

15. The method of claim 5 wherein a set of permutation and shortening maps for successive retransmissions i=1 to 19 is shown in the following table, wherein each permutation and shortening map corresponds to a base LDPC parity code matrix as defined by 802.11REVmdD3.2 for an LDPC code with code block length 1944, Z=81 and code rate 5/6, wherein each row i=1 to 19 defines a respective permutation and shortening map, and for each row i, a blank location under a column index j indicates a set of Z bits in the second source word at a location corresponding to the index j are to be set to zero and a value under a column location j indicates that a set of Z bits in the first source word at a location corresponding to that value are to be copied to a Z-bit location in the second source word at a location corresponding to the index j:

| i | Rate | $|f_i|$ | 0 | 1 | 2 | 3 | 4 | 5 | 6 | 7 | 8 | 9 | 10 | 11 | 12 | 13 | 14 | 15 | 16 | 17 | 18 | 19 |
|---|---|---|---|---|---|---|---|---|---|---|---|---|---|---|---|---|---|---|---|---|---|---|
| 0 | 0.833 | | | | | | | | | | | | | | | | | | | | | |
| 1 | 0.714 | 11 | 1 | 8 | | | | 6 | | 7 | | 10 | | 5 | 0 | 19 | 4 | | | | 9 | 18 |
| 2 | 0.625 | 7 | 7 | | | 8 | 17 | 10 | | | | | | 1 | | | | 15 | 13 | | | |
| 3 | 0.556 | 6 | | | 7 | | | | | 19 | | 6 | | | | | | 8 | 12 | 2 | | |
| 4 | 0.500 | 5 | | | | | 10 | | 7 | 8 | | | | | | | 16 | | | | | 9 |
| 5 | 0.455 | 5 | | 3 | 7 | | | | | 10 | | | | | | | | 1 | | 19 | | |
| 6 | 0.417 | 4 | | 7 | | 10 | | | | | | | 4 | | | | | 11 | | | | |
| 7 | 0.385 | 4 | | | | | | | 8 | 7 | | 17 | | | | | | | | 2 | | |
| 8 | 0.357 | 4 | | 8 | | | | | | | | | | | | 10 | 19 | 5 | | | | |
| 9 | 0.333 | 4 | 7 | 19 | | | | | | | | | | | | | | | | 0 | 10 | |
| 10 | 0.313 | 4 | | | | 8 | | | | | 10 | | | | 14 | | | | | | | 7 |
| 11 | 0.294 | 4 | | | | | 8 | | 10 | | | | 6 | | | | 9 | | | | | |
| 12 | 0.278 | 3 | | | | | | 8 | | | | 15 | | | | | | | 10 | | | |
| 13 | 0.263 | 2 | | | | 19 | | | | | | | | | 1 | | | | | | | |
| 14 | 0.250 | 2 | | | 19 | | | | | | | | | | | | 4 | | | | | |
| 15 | 0.238 | 2 | | | | 19 | | | | | | | | | | | | | | | 2 | |
| 16 | 0.227 | 2 | | | | | 19 | | | | | | | | | | | | | | | 9 |
| 17 | 0.217 | 2 | | | | | | | | 19 | | | | | | | | | | | 15 | |
| 18 | 0.208 | 2 | | | | | | 15 | | | | | | | | | | | | | 18 | |
| 19 | 0.200 | 2 | | | | | | | | | | | | | | 13 | 11 | | | | | |

16. The method of claim 5 wherein a set of permutation and shortening maps for successive retransmissions i=1 to 8 is shown in the following table, wherein each permutation and shortening map corresponds to a base LDPC parity code matrix as defined by 802.11REVmdD3.2 for an LDPC code with code block length 1296, Z=54 and code rate 1/2, wherein each row i=1 to 8 defines a respective permutation and shortening map, and for each row i, a blank location under a column index j indicates a set of Z bits in the second source word at a location corresponding to the index j are to be set to zero and a value under a column location j indicates that a set of Z bits in the first source word at a location corresponding to that value are to be copied to a Z-bit location in the second source word at a location corresponding to the index j:

| i | Rate | $|f_i|$ | 0 | 1 | 2 | 3 | 4 | 5 | 6 | 7 | 8 | 9 | 10 | 11 |
|---|---|---|---|---|---|---|---|---|---|---|---|---|---|---|
| 0 | 0.500 | | | | | | | | | | | | | |
| 1 | 0.333 | 7 | | | | 7 | 8 | 2 | 11 | | 4 | 3 | 5 | |
| 2 | 0.250 | 6 | | | | 0 | 8 | | 6 | 9 | 4 | 11 | | |
| 3 | 0.200 | 5 | | 8 | | 10 | | 4 | | | | 3 | | 0 |
| 4 | 0.167 | 5 | | | | | 5 | 8 | | 0 | 4 | 1 | | |
| 5 | 0.143 | 5 | | | | | 7 | 8 | | | | 11 | | 4 |
| 6 | 0.125 | 4 | | | | | 3 | 4 | 9 | | 8 | | | |
| 7 | 0.111 | 4 | | | | | | 5 | 11 | | 8 | | 4 | |
| 8 | 0.100 | 4 | | | | | 4 | | | 0 | 8 | | 2 | |

17. The method of claim 5 wherein a set of permutation and shortening maps for successive retransmissions i=1 to 17 is shown in the following table, wherein each permutation and shortening map corresponds to a base LDPC parity code matrix as defined by 802.11REVmdD3.2 for an LDPC code with code block length 1296, Z=54 and code rate 2/3, wherein each row i=1 to 17 defines a respective permutation and shortening map, and for each row i, a blank location under a column index j indicates a set of Z bits in the second source word at a location corresponding to the index j are to be set to zero and a value under a column location j indicates that a set of Z bits in the first source word at a location corresponding to that value are to be copied to a Z-bit location in the second source word at a location corresponding to the index j:

| i | Rate | $|f_i|$ | 0 | 1 | 2 | 3 | 4 | 5 | 6 | 7 | 8 | 9 | 10 | 11 | 12 | 13 | 14 | 15 |
|---|------|-----|---|---|---|---|---|---|---|---|---|---|----|----|----|----|----|----|
| 0 | 0.667 |   |   |   |   |   |   |   |   |   |   |   |    |    |    |    |    |    |
| 1 | 0.500 | 9 | 0 | 2 |   |   |   |   | 8 | 7 |   |   | 11 | 1  |    | 10 |    | 9  | 6 |
| 2 | 0.400 | 7 | 0 | 2 |   | 10 |  |   | 12 |  |   |   | 4  | 7  |    | 14 |    |   |
| 3 | 0.333 | 6 |   | 10 | 0 |   | 2 |   | 13 |  | 3 |   | 15 |    |    |    | 8  |   |
| 4 | 0.286 | 5 |   |   |   | 0 | 2 |   |   |   |   |   | 15 |    |    | 1  |    | 4 |
| 5 | 0.250 | 5 |   | 0 | 2 |   |   |   |   |   |   | 4 |    |    |    | 8  |    | 6 |
| 6 | 0.222 | 5 | 0 |   |   | 4 |   |   |   |   |   |   | 7  |    |    | 10 |    | 5 |
| 7 | 0.200 | 4 |   | 10 |  |   |   |   |   | 1 | 0 |   | 12 |    |    |    | 3  |   |
| 8 | 0.182 | 3 |   |   | 2 |   |   |   |   |   |   | 4 |    |    |    |    | 3  |   |
| 9 | 0.167 | 3 |   |   |   | 0 | 1 |   |   |   |   |   |    |    | 11 |    |    |   |
| 10 | 0.154 | 3 |   |   |   | 2 | 1 |   |   |   |   | 7 |    |    |    |    |    |   |
| 11 | 0.142 | 3 |   |   |   | 2 |   |   |   | 8 |   |   |    |    | 10 |    |    |   |
| 12 | 0.133 | 3 |   |   | 2 |   | 4 |   |   |   |   | 9 |    |    |    |    |    |   |
| 13 | 0.125 | 3 |   |   |   | 0 |   |   |   |   |   |   |    | 4  |    |    | 14 |   |
| 14 | 0.118 | 3 |   | 1 | 2 |   |   |   |   |   |   |   |    |    |    | 13 |    |   |
| 15 | 0.111 | 3 |   |   | 10 |  |   |   |   | 15 |  |  |    |    |    |    |    | 5 |
| 16 | 0.105 | 3 |   |   |   |   |   |   |   |   |   |   |    | 4  | 1  | 0  |    |   |
| 17 | 0.100 | 3 |   |   | 2 |   |   |   |   |   |   |   |    |    | 10 | 6. |    |   |

18. The method of claim 5 wherein a set of permutation and shortening maps is selected from a group consisting of the following:

(i) the set of permutation and shortening maps for successive retransmissions i=1 to 19 as shown in the following table, wherein each permutation and shortening map corresponds to a base LDPC parity code matrix as defined by 802.11REVmdD3.2 for an LDPC code with code block length 1296, Z=54 and code rate 3/4, wherein each row i=1 to 19 defines a respective permutation and shortening map, and for each row i, a blank location under a column index j indicates a set of Z bits in the second source word at a location corresponding to the index j are to be set to zero and a value under a column location j indicates that a set of Z bits in the first source word at a location corresponding to that value are to be copied to a Z-bit location in the second source word at a location corresponding to the index j:

| i | Rate | $|f_i|$ | 0 | 1 | 2 | 3 | 4 | 5 | 6 | 7 | 8 | 9 | 10 | 11 | 12 | 13 | 14 | 15 | 16 | 17 |
|---|------|-----|---|---|---|---|---|---|---|---|---|---|----|----|----|----|----|----|----|----|
| 0 | 0.750 |  |   |   |   |   |   |   |   |   |   |   |    |    |    |    |    |    |    |    |
| 1 | 0.600 | 10 | 10 |  |   | 3 | 5 | 0 |   | 13 | 6 | 7 | 12 | 4  |    | 1  | 8  |    | 1  | 0  |
| 2 | 0.500 | 7 |   |   | 3 | 5 |   |   |   |   |   |   |    | 14 | 17 | 9  |    | 1  | 0  |   |
| 3 | 0.429 | 6 |   |   |   | 3 |   |   | 1 |   | 16 |  |    | 2  |    | 5  |    |    | 8  |   |
| 4 | 0.375 | 5 |   | 3 |   |   |   | 5 |   |   |   | 6 |    |    | 11 |    |    |    | 0  |   |
| 5 | 0.333 | 5 |   |   | 5 |   |   |   | 1 | 3 |   |   |    |    | 15 |    | 7  |    |    |   |
| 6 | 0.300 | 5 |   | 5 |   |   | 3 |   |   |   |   | 14 |   |    |    |    | 0  | 8  |    |   |
| 7 | 0.273 | 5 |   |   | 3 |   |   |   |   | 5 |   |   | 0  | 4  | 1  |    |    |    |    |   |
| 8 | 0.250 | 4 | 5 |   |   |   |   | 3 |   |   | 13 |  |    |    |    |    | 10 |    |    | 5 |
| 9 | 0.231 | 4 | 3 |   |   | 0 |   |   |   |   | 12 |  |    |    |    |    |    |    |    | 5 |
| 10 | 0.214 | 4 |   | 5 |   |   |   |   |   |   |   |   |    |    | 13 | 3  | 17 |    |    |   |
| 11 | 0.200 | 4 |   | 3 |   |   |   |   | 0 |   |   | 2 |    |    |    |    |    |    |    | 1 |
| 12 | 0.188 | 3 |   |   |   |   | 5 |   |   |   |   |   |    |    |    |    |    |    | 6  | 1 |
| 13 | 0.176 | 3 |   | 3 |   |   |   |   |   |   |   |   |    |    | 13 |    | 8  |    |    |   |
| 14 | 0.167 | 3 | 3 |   |   |   |   |   |   |   |   |   |    |    |    |    |    |    | 0  | 13 |
| 15 | 0.158 | 3 |   | 5 |   |   |   |   |   |   | 1 | 15 |   |    |    |    |    |    |    |   |
| 16 | 0.150 | 3 |   |   | 1 |   |   |   | 3 |   |   | 9 |    |    |    |    |    |    |    |   |

-continued

| i | Rate | |f_i| | 0 | 1 | 2 | 3 | 4 | 5 | 6 | 7 | 8 | 9 | 10 | 11 | 12 | 13 | 14 | 15 | 16 | 17 |
|---|------|-----|---|---|---|---|---|---|---|---|---|---|----|----|----|----|----|----|----|----|
| 17 | 0.142 | 3 |   |   |   |   |   | 3 | 5 |   |   |   |    |    |    | 16 |    |    |    |    |
| 18 | 0.136 | 3 |   |   | 3 |   |   |   |   |   | 11 |  |    |    |    |    |    |    | 10 |    |
| 19 | 0.130 | 3 |   |   |   |   |   |   | 0 |   |   |   |    |    |    | 1  |    | 5  |    |    |

(ii) the set of permutation and shortening maps for successive retransmissions i=1 to 19 as shown in the following table, wherein each permutation and shortening map corresponds to a base LDPC parity code matrix as defined by 802.11REVmdD3.2 for an LDPC code with code block length n=1296, k=1080, Z=54, wherein each row i=1 to 19 defines a respective permutation and shortening map, and for each row i, a blank location under a column index j indicates a set of Z bits in the second source word at a location corresponding to the index j are to be set to zero and a value under a column location j indicates that a set of Z bits in the first source word at a location corresponding to that value are to be copied to a Z-bit location in the second source word at a location corresponding to the index j:

| i | Rate | |f_i| | 0 | 1 | 2 | 3 | 4 | 5 | 6 | 7 | 8 | 9 | 10 | 11 | 12 | 13 | 14 | 15 | 16 | 17 | 18 | 19 |
|---|------|-----|---|---|---|---|---|---|---|---|---|---|----|----|----|----|----|----|----|----|----|----|
| 0 | 0.833 |   |   |   |   |   |   |   |   |   |   |   |    |    |    |    |    |    |    |    |    |    |
| 1 | 0.714 | 11 | 5 | 2 |   |   |   | 10 |   | 3 |   | 9 | 6  |    |    |    |    | 14 | 1  | 13 | 12 | 8  |
| 2 | 0.625 | 7  |   | 5 |   |   |   | 10 | 2 |   | 3 |   |    | 0  |    |    |    |    | 15 | 18 |    |    |
| 3 | 0.556 | 6  | 14 |  |   | 3 |   | 10 |   |   |   |   |    |    |    |    |    | 11 | 6  |    |    | 4  |
| 4 | 0.500 | 5  |   |   |   |   |   | 5 |   | 3 |   |   | 19 |    | 10 |    |    |    | 9  |    |    | 14 |
| 5 | 0.455 | 4  | 3 |   |   |   |   | 2 |   |   |   |   |    |    |    |    |    |    | 7  |    | 0  | 1  |
| 6 | 0.417 | 4  |   |   |   |   | 10 |   |   |   | 3 |   |    |    |    |    |    |    |    |    | 0  | 1  |
| 7 | 0.385 | 4  |   |   |   |   |   |   |   |   |   |   |    |    |    | 6  | 10 |    | 16 | 3  |    |    |
| 8 | 0.357 | 4  |   |   |   |   | 3 |   | 10 |   |   |   |    | 5  |    |    | 14 | 17 |    | 12 |    |    |
| 9 | 0.333 | 4  |   |   |   | 10 |  |   |   |   | 3 |   |    |    |    |    | 14 | 17 |    |    |    |    |
| 10 | 0.313 | 3 |   |   |   |   |   | 10 |   |   |   |   |    | 5  |    |    | 8  |    |    |    |    |    |
| 11 | 0.294 | 3 |   |   |   |   |   |   |   | 10 |  |   |    |    |    |    | 2  |    |    |    |    | 11 |
| 12 | 0.278 | 3 |   |   | 3 |   |   |   | 10 |  |   |   |    |    |    |    |    | 15 |    |    |    |    |
| 13 | 0.263 | 3 |   | 0 |   |   | 3 |   |   |   |   |   |    |    |    |    |    | 6  |    |    |    |    |
| 14 | 0.250 | 3 |   |   |   |   |   |   |   |   |   | 3 |    |    |    |    | 19 |    |    |    |    | 14 |
| 15 | 0.238 | 3 |   |   |   |   |   |   |   |   |   |   |    |    |    |    | 2  |    |    | 10 |    | 5  |
| 16 | 0.227 | 3 |   |   |   |   | 10 |  |   |   |   |   |    |    |    |    |    | 14 |    | 0  |    |    |
| 17 | 0.217 | 2 |   |   |   |   |   |   |   |   |   |   | 3  |    |    |    | 5  |    |    |    |    |    |
| 18 | 0.208 | 2 |   |   |   |   |   |   |   |   |   |   |    |    |    | 10 |    |    |    | 13 |    |    |
| 19 | 0.200 | 2 |   |   |   |   | 14 |  |   |   |   |   |    |    |    |    |    |    |    | 4  |    |    |

(iii) the set of permutation and shortening maps for successive retransmissions i=1 to 8 as shown in the following table, wherein each permutation and shortening map corresponds to a base LDPC parity code matrix as defined by 802.11REVmdD3.2 for an LDPC code with code block length 648, Z=27 and code rate 1/2, wherein each row i=1 to 8 defines a respective permutation and shortening map, and for each row i, a blank location under a column index j indicates a set of Z bits in the second source word at a location corresponding to the index j are to be set to zero and a value under a column location j indicates that a set of Z bits in the first source word at a location corresponding to that value are to be copied to a Z-bit location in the second source word at a location corresponding to the index j:

| i | Rate | |f_i| | 0 | 1 | 2 | 3 | 4 | 5 | 6 | 7 | 8 | 9 | 10 | 11 |
|---|------|-----|---|---|---|---|---|---|---|---|---|---|----|----|
| 0 | 0.500 |   |   |   |   |   |   |   |   |   |   |   |    |    |
| 1 | 0.333 | 7 | 0 | 1 |   | 9 | 4 | 3 | 11 |  |   | 7 |    |    |
| 2 | 0.250 | 6 | 0 | 10 |  |   | 4 |   | 3 |   | 5 |   |    | 8  |
| 3 | 0.200 | 5 | 4 | 11 |  |   | 0 |   | 2 |   |   |   | 3  |    |
| 4 | 0.167 | 5 |   |   |   | 8 |   | 3 | 4 |   |   | 0 | 6  |    |
| 5 | 0.143 | 5 |   |   |   |   | 4 | 9 | 0 |   |   | 7 |    | 3  |
| 6 | 0.125 | 4 |   |   | 11 |  |   | 10 | 4 |  |   | 0 |    |    |
| 7 | 0.111 | 3 |   |   |   |   |   | 4 |   | 8 |   | 7 |    |    |
| 8 | 0.100 | 3 |   |   | 1 |   |   | 0 |   |   |   |   |    | 3  |

(iv) the set of permutation and shortening maps for successive retransmissions i=1 to 15 as shown in the following table, wherein each permutation and shortening map corresponds to a base LDPC parity code matrix as defined by 802.11REVmdD3.2 for an LDPC code with code block length 648, $Z=27$ and code rate 2/3, wherein each row i=1 to 15 defines a respective permutation and shortening map, and for each row i, a blank location under a column index j indicates a set of Z bits in the second source word at a location corresponding to the index j are to be set to zero and a value under a column location j indicates that a set of Z bits in the first source word at a location corresponding to that value are to be copied to a Z-bit location in the second source word at a location corresponding to the index j:

| i | Rate | $|f_i|$ | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|---|---|
| 0 | 0.667 | | | | | | | | | | | | | | | | | |
| 1 | 0.500 | 9 | 0 | 1 | | | | | 8 | 5 | | 7 | 10 | | | 2 | 4 | 14 |
| 2 | 0.400 | 6 | | | 1 | | | | 0 | 2 | | | 13 | 3 | 12 | | | |
| 3 | 0.333 | 6 | 0 | | 1 | | | | | | | | 15 | 6 | 4 | | | 2 |
| 4 | 0.286 | 5 | | 1 | | 0 | | | 2 | | | | 9 | | 14 | | 2 | 5 |
| 5 | 0.250 | 5 | 0 | | 1 | | | | | | | 7 | | | | | 2 | 5 |
| 6 | 0.222 | 4 | | 0 | | 2 | | | | | | | | | | 3 | 4 | |
| 7 | 0.200 | 4 | | 1 | 2 | | | | | | | | | | 11 | | 13 | |
| 8 | 0.182 | 4 | | 0 | 2 | | | | | | | 1 | | | 8 | | | |
| 9 | 0.167 | 4 | 0 | | | | 1 | | | | | | | | | | 14 | 6 |
| 10 | 0.154 | 4 | 0 | | | | | 2 | | | | | 13 | 7 | | | | |
| 11 | 0.142 | 3 | | | | 1 | | | 0 | | | | | | 4 | | | |
| 12 | 0.133 | 3 | 0 | | | | | | | | | 7 | 14 | | | | | |
| 13 | 0.125 | 3 | | | 1 | | | | | | | | 12 | | | 10 | | |
| 14 | 0.118 | 3 | | | | 2 | | | | | | 0 | 15 | | | | | |
| 15 | 0.111 | 3 | 0 | | | | | | | | | 9 | | | | 11 | | |

(v) the set of permutation and shortening maps successive retransmissions i=1 to 19 as shown in the following table, wherein each permutation and shortening map corresponds to a base LDPC parity code matrix as defined by 802.11REVmdD3.2 for an LDPC code with code block length 648, $Z=27$ and code rate 3/4, wherein each row i=1 to 19 defines a respective permutation and shortening map, and for each row i, a blank location under a column index j indicates a set of Z bits in the second source word at a location corresponding to the index j are to be set to zero and a value under a column location j indicates that a set of Z bits in the first source word at a location corresponding to that value are to be copied to a Z-bit location in the second source word at a location corresponding to the index j:

| i | Rate | $|f_i|$ | 0 | 1 | 2 | 3 | 4 | 5 | 6 | 7 | 8 | 9 | 10 | 11 | 12 | 13 | 14 | 15 | 16 | 17 |
|---|---|---|---|---|---|---|---|---|---|---|---|---|---|---|---|---|---|---|---|---|
| 0 | 0.750 | | | | | | | | | | | | | | | | | | | |
| 1 | 0.600 | 10 | | | 3 | | 16 | 1 | | 0 | | | 10 | | 7 | 4 | 5 | 13 | | 2 |
| 2 | 0.500 | 7 | | 16 | | 3 | | 12 | | | | 0 | | | 2 | | 14 | | | 17 |
| 3 | 0.429 | 7 | | 3 | | 12 | | | 0 | | | | 1 | | | 6 | | | 11 | 16 |
| 4 | 0.375 | 6 | | | 16 | | 12 | | | | | | | | 3 | 7 | | | 9 | 0 |
| 5 | 0.333 | 6 | 12 | | | 0 | | 3 | | | | | | | 4 | | | 15 | | 1 |
| 6 | 0.300 | 4 | | | | | | 3 | | | | | | | 10 | 12 | | | | 1 |
| 7 | 0.273 | 4 | | | | 3 | | | | | | | | 16 | | | | 0 | | 2 |
| 8 | 0.250 | 4 | | | 12 | | | | | | | 0 | | 8 | | | | 6 | | |
| 9 | 0.231 | 4 | | | | | | 3 | | | | | 1 | | | 13 | | 12 | | |
| 10 | 0.214 | 4 | | | 0 | | | | | | | | 3 | 17 | | | 7 | | | |
| 11 | 0.200 | 3 | | 3 | | | | | | | | | | 6 | 16 | | | | | |
| 12 | 0.188 | 3 | | 12 | | 3 | | | | | | | | | | 4 | | | | |
| 13 | 0.176 | 3 | | 3 | | | | | | | | | | 7 | | | 1 | | | |
| 14 | 0.167 | 3 | | 12 | | 0 | | | | | | | | | | | 5 | | | |
| 15 | 0.158 | 3 | | | | | 16 | 3 | | | | | | | | | 14 | | | |
| 16 | 0.150 | 3 | | | | | | | | | | 0 | | 8 | 1 | | | | | |
| 17 | 0.142 | 3 | | 16 | | | | | | | | | | 9 | | 15 | | | | |
| 18 | 0.136 | 3 | | | | | | | | | | 12 | | | 1 | 16 | | | | |
| 19 | 0.130 | 3 | | | | | 12 | | | | | 12 | | | | | 11 | 5 | | | and (vi) the set of permutation and shortening maps for successive retransmissions i=1 to 19 as shown in the following table, wherein each permutation and shortening map corresponds to a base LDPC parity code matrix as defined by 802.11REVmdD3.2 for an LDPC code with code block length 648, Z=27 and code rate 5/6, wherein each row i=1 to 19 defines a respective permutation and shortening map, and for each row i, a blank location under a column index j indicates a set of Z bits in the second source word at a location corresponding to the index j are to be set to zero and a value under a column location j indicates that a set of Z bits in the first source word at a location corresponding to that value are to be copied to a Z-bit location in the second source word at a location corresponding to the index j:

| i | Rate | $|f_i|$ | 0 | 1 | 2 | 3 | 4 | 5 | 6 | 7 | 8 | 9 | 10 | 11 | 12 | 13 | 14 | 15 | 16 | 17 | 18 | 19 |
|---|------|-----|---|---|---|---|---|---|---|---|---|---|----|----|----|----|----|----|----|----|----|----|
| 0 | 0.833 |   |   |   |   |   |   |   |   |   |   |   |    |    |    |    |    |    |    |    |    |    |
| 1 | 0.714 | 11 |   | 7 |   |   | 8 |   | 10 |   | 18 |   |    | 17 | 3  | 19 | 1  | 4  | 11 | 9  |    |    |
| 2 | 0.625 | 7 |   |   |   | 7 | 0 | 18 | 9 |   |   |   |    |    | 15 | 8  |    |    |    | 6  |    |    |
| 3 | 0.556 | 6 |   |   | 11 |   |   |   |   |   | 18 | 8 | 5  | 2  |    |    |    |    |    |    |    | 1  |
| 4 | 0.500 | 5 |   | 8 |   |   |   | 9 |   |   |   |   |    | 17 | 13 |    |    | 18 |    |    |    |    |
| 5 | 0.455 | 4 |   |   | 8 |   |   |   |   |   | 11 |   |    | 14 |    |    |    |    | 7  |    |    |    |
| 6 | 0.417 | 4 |   |   |   | 18 |   |   |   |   |   |   |    | 0  |    |    |    | 10 |    | 8  |    |    |
| 7 | 0.385 | 4 |   |   |   |   |   |   | 18 |   |   |   | 1  | 3  |    |    | 8  |    |    |    |    |    |
| 8 | 0.357 | 4 |   |   |   |   |   |   | 8 |   |   |   |    | 9  | 18 |    |    |    |    | 12 |    |    |
| 9 | 0.333 | 3 | 18 |   |   |   | 8 |   |   |   |   |   |    |    |    |    |    | 11 |    |    |    |    |
| 10 | 0.313 | 3 | 8 |   |   |   |   | 6 |   |   |   |   |    | 4  |    |    |    |    |    |    |    |    |
| 11 | 0.294 | 3 |   |   |   | 18 |   |   |   |   |   |   |    | 17 |    |    |    |    |    |    |    | 5  |
| 12 | 0.278 | 3 |   |   |   |   |   |   |   |   |   |   |    | 0  |    |    |    | 18 |    | 6  |    |    |
| 13 | 0.263 | 3 |   | 18 |   | 5 |   |   |   |   |   |   |    | 16 |    |    |    |    |    |    |    |    |
| 14 | 0.250 | 2 |   | 18 |   |   |   |   |   |   |   |   |    | 7  |    |    |    |    |    |    |    |    |
| 15 | 0.238 | 2 |   |   |   |   |   |   |   |   |   |   |    | 9  |    | 1  |    |    |    |    |    |    |
| 16 | 0.227 | 2 |   |   |   |   |   |   |   |   |   |   | 5  | 6  |    |    |    |    |    |    |    |    |
| 17 | 0.217 | 2 | 18 |   |   |   |   |   |   |   |   |   |    | 1  |    |    |    |    |    |    |    |    |
| 18 | 0.208 | 2 |   |   |   |   |   |   |   |   |   |   |    | 5  |    | 8  |    |    |    |    |    |    |
| 19 | 0.200 | 2 |   |   |   |   |   | 18 |   |   |   |   |    | 19 |    |    |    |    |    |    |    |    |

19. A wireless transmitting station configured to perform the method of claim 1.

20. A non-volatile computer readable medium storing instructions for configuring a wireless transmitting station configured to perform the method of claim 1.

* * * * *

UNITED STATES PATENT AND TRADEMARK OFFICE
CERTIFICATE OF CORRECTION

| | |
|---|---|
| PATENT NO. | : 12,149,347 B2 |
| APPLICATION NO. | : 18/170854 |
| DATED | : November 19, 2024 |
| INVENTOR(S) | : Guido Montorsi et al. |

Page 1 of 1

It is certified that error appears in the above-identified patent and that said Letters Patent is hereby corrected as shown below:

In the Claims

Claim 7, Column 28, Lines 31-32: "The method of claim 6 wherein the method can include comprises" should read -- The method of claim 6 wherein the method comprises --.

Signed and Sealed this
Fourth Day of March, 2025

Coke Morgan Stewart
*Acting Director of the United States Patent and Trademark Office*